(12) United States Patent
Min et al.

(10) Patent No.: US 10,461,696 B2
(45) Date of Patent: Oct. 29, 2019

(54) SWITCHED CAPACITOR BANKS

(71) Applicant: Analog Devices, Inc., Norwood, MA (US)

(72) Inventors: Byungmoo Min, Lexington, MA (US); John A. Chiesa, Pelham, NH (US)

(73) Assignee: Analog Devices, Inc., Norwood, MA (US)

( * ) Notice: Subject to any disclaimer, the term of this patent is extended or adjusted under 35 U.S.C. 154(b) by 56 days.

(21) Appl. No.: 15/791,250

(22) Filed: Oct. 23, 2017

(65) Prior Publication Data

US 2019/0123687 A1 Apr. 25, 2019

(51) Int. Cl.
*H03B 5/12* (2006.01)
*H03B 5/18* (2006.01)

(52) U.S. Cl.
CPC ......... *H03B 5/1265* (2013.01); *H03B 5/1203* (2013.01); *H03B 5/1231* (2013.01); *H03B 5/1841* (2013.01); *H03B 5/1847* (2013.01); *H03B 2200/004* (2013.01); *H03B 2200/005* (2013.01); *H03B 2200/009* (2013.01); *H03B 2200/0034* (2013.01); *H03B 2201/0266* (2013.01)

(58) Field of Classification Search
CPC .................................................. H03B 5/1265
USPC ........................................... 331/36 C, 177 V
See application file for complete search history.

(56) References Cited

U.S. PATENT DOCUMENTS

| | | | |
|---|---|---|---|
| 4,490,706 A | 12/1984 | Satou et al. | |
| 4,783,639 A | 11/1988 | Hudspeth et al. | |
| 5,610,560 A * | 3/1997 | Sauer | H03L 7/0991 331/11 |
| 6,320,491 B1 | 11/2001 | Gevorgian et al. | |
| 6,452,473 B1 | 9/2002 | Suzuki et al. | |
| 6,535,094 B2 | 3/2003 | Murata et al. | |
| 6,686,804 B1 | 2/2004 | Adams et al. | |
| 6,774,866 B2 | 8/2004 | McKinzie, III et al. | |
| 6,778,022 B1 | 8/2004 | Zhang et al. | |
| 6,794,977 B2 | 9/2004 | Christensen | |
| 6,798,011 B2 | 9/2004 | Adan | |

(Continued)

FOREIGN PATENT DOCUMENTS

| | | |
|---|---|---|
| EP | 2 575 259 | 4/2013 |
| WO | WO 2017/011116 | 1/2017 |

OTHER PUBLICATIONS

European Search Report dated Mar. 7, 2019 for European App. No. 18201951.3 (9 pgs).

(Continued)

*Primary Examiner* — Joseph Chang
(74) *Attorney, Agent, or Firm* — Knobbe, Martens, Olson & Bear, LLP

(57) ABSTRACT

An LC tank circuit, such as an LC tank circuit of a step-tuned voltage controlled oscillator, includes a plurality of switched capacitor banks and one or more inductors. A first switched capacitor bank switch in response to a range of control signals used to control the VCO output across a range of frequencies. A second switched capacitor bank can switch in response to a subset of the range of control signals used to control the VCO output across a subset of the range of frequencies. The control scheme for the first and second switched capacitor banks can improves the linearity of changes in the frequency of the output signal of the VCO.

20 Claims, 17 Drawing Sheets

(56) References Cited

U.S. PATENT DOCUMENTS

| | | |
|---|---|---|
| 6,803,829 B2 | 10/2004 | Duncan et al. |
| 6,842,101 B2 | 1/2005 | Maguire et al. |
| 6,943,635 B1 | 9/2005 | Kaltenecker |
| 7,099,643 B2 | 8/2006 | Lin |
| 7,109,837 B2 | 9/2006 | Watts et al. |
| 7,145,786 B2 | 12/2006 | Vinciarelli |
| 7,221,234 B2 | 5/2007 | Chien |
| 7,501,903 B2 | 3/2009 | Gabara |
| 7,518,458 B2 | 4/2009 | Nakamura et al. |
| 7,554,795 B2 | 6/2009 | Hidaka et al. |
| 7,785,697 B2 | 8/2010 | Masai et al. |
| 7,855,610 B2 | 12/2010 | Taghivand et al. |
| 8,970,315 B2 | 3/2015 | Shanan |
| 9,118,335 B2 | 8/2015 | Wu et al. |
| 9,325,277 B1 | 4/2016 | Bekele et al. |
| 9,406,432 B2 | 8/2016 | Nakamura et al. |
| 9,425,737 B1 | 8/2016 | Bushman et al. |
| 9,602,051 B1 | 3/2017 | Yavorskyy et al. |
| 2003/0224747 A1 | 12/2003 | Anand |
| 2004/0150483 A1 | 8/2004 | Cho |
| 2005/0104204 A1 | 5/2005 | Kawakubo et al. |
| 2005/0145408 A1 | 7/2005 | Hess |
| 2006/0055476 A1 | 3/2006 | Kazakov et al. |
| 2007/0253144 A1 | 11/2007 | Kuwajima |
| 2008/0129398 A1 | 6/2008 | Ballantyne et al. |
| 2008/0143446 A1 | 6/2008 | Yao et al. |
| 2008/0316111 A1 | 12/2008 | Aoyama et al. |
| 2009/0066431 A1 | 3/2009 | Shin et al. |
| 2009/0253385 A1 | 10/2009 | Dent et al. |
| 2010/0052795 A1 | 3/2010 | Nakamura et al. |
| 2010/0157565 A1 | 6/2010 | Yoshida et al. |
| 2010/0283551 A1* | 11/2010 | Zeng ............ H03B 5/1228 331/117 FE |
| 2011/0018642 A1 | 1/2011 | Li et al. |
| 2011/0050191 A1 | 3/2011 | Tsuji et al. |
| 2012/0262238 A1 | 10/2012 | Dong et al. |
| 2013/0181783 A1 | 7/2013 | Upadhyaya |
| 2017/0040943 A1 | 2/2017 | Pavao-Moreira et al. |

OTHER PUBLICATIONS

Partial European Search Report dated Apr. 11, 2019 for European Patent App. No. 18201952.1 (12 pgs).

* cited by examiner

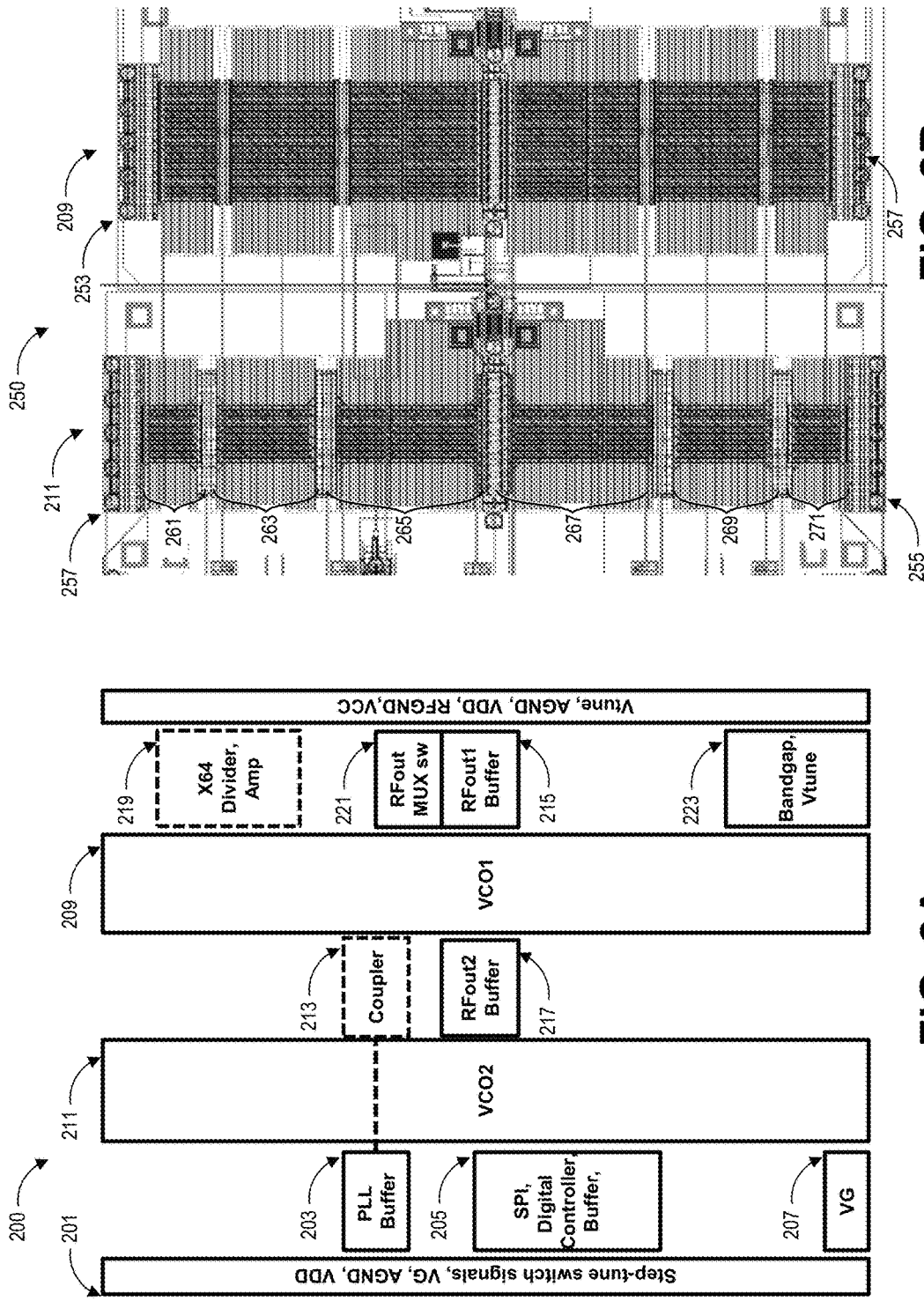

SWITCHED CAPACITOR BANKS

RELATED APPLICATION

This application is also related to U.S. patent application Ser. No. 15/791,227, filed on even date herewith and titled "INDUCTOR CURRENT DISTRIBUTION," the disclosure of which is hereby incorporated by reference in its entirety.

FIELD OF DISCLOSURE

This disclosure relates to electronic circuits and, more particularly, to capacitors in LC circuits.

BACKGROUND

Voltage-controlled oscillators (VCOs) are electronic circuits that provide an output signal that has a frequency that is controlled, at least in part, by a voltage of an input signal. In practice, a VCO typically includes non-ideal components and the behavior of the VCO may be non-ideal.

A VCO can include an inductor and a switched capacitor bank. Current can flow through the inductor to and/or from the switched capacitor circuit. Current flow through the inductor can impact performance of the VCO.

VCOs can have an output frequency that is controlled in steps. A switched capacitor bank can include capacitors that are selectively switched in and switched out with the inductor to control frequency steps. It can be difficult to control the output frequency as the number of steps increases while maintaining relatively good phase noise performance.

SUMMARY OF THE DISCLOSURE

Some aspects of this disclosure feature a voltage-controlled oscillator (VCO) comprising: an output node configured to provide an oscillating signal that has a frequency based at least in part on a voltage of an input signal, the oscillating signal being within a frequency range, and a tank circuit comprising: a first switched capacitor bank operable to change the frequency of the oscillating signal over a first portion and a second portion of the frequency range; a second switched capacitor bank coupled to the first switched capacitor bank, the second switched capacitor bank operable to change the frequency of the oscillating signal over the second portion of the frequency range, wherein changes in frequency of the oscillating signal are independent of the second switched capacitor bank over the first portion of the frequency range; and an inductor coupled to the first switched capacitor bank and to the second switched capacitor bank.

Some aspects of this disclosure feature a variable capacitance circuit comprising: a first port; a second port, wherein an effective capacitance across the first port to the second port is controlled by a control signal; a first switched capacitor bank configured to change the effective capacitance in response to changes in the control signal across a range of values; and a second switched capacitor bank configured to change the effective capacitance in response to changes in the control signal across a first subset of the range of values, wherein changes in the effective capacitance are independent of the second switched capacitor bank when the control signal changes across a second subset of the range of values.

Some aspects of this disclosure feature a method for adjusting an effective capacitance of a variable capacitance circuit comprising a first switched capacitor bank and a second switched capacitor bank, the method comprising: switching one or more first switched capacitor circuits in the first switched capacitor bank to adjust the effective capacitance of the variable capacitance circuit independent of the second switched capacitor bank; and switching one or more second switched capacitor circuits in the second switched capacitor bank and at least one of the first switched capacitor circuits to adjust the effective capacitance of the variable capacitance circuit using both the first capacitor bank and the second capacitor bank.

Some aspects of this disclosure feature a voltage-controlled oscillator (VCO) comprising: an output node configured to provide an oscillating signal that is based at least in part on a voltage of an input signal; and a tank circuit configured to affect the oscillating signal. The tank circuit can include: an inductor comprising a body extending along a first direction and an extension that extends from the body at a non-zero angle relative to the first direction; and a first capacitance circuit coupled to the extension.

Some aspects of the disclosure feature an LC circuit comprising: an inductor and a plurality of capacitors coupled to the extension at different points. The inductor includes: a body extending along a first direction; an extension that extends from the body at a non-zero angle relative to the first direction; and a chamfered joint between the body and the extension.

Some aspects of the disclosure feature a method for current distribution in an oscillator using an inductor, the method comprising: directing current through the inductor to switched capacitor circuits such that portions of the current flow along an outside skin depth of a body of the inductor, flow through a portion of a chamfered joint of the inductor, and branch into different paths to respective ones of the switched capacitor circuits; and generating an oscillating signal using the inductor and at least one of the switched capacitor circuits.

For purposes of providing a summary, certain aspects, advantages, and novel features have been described. It is to be understood that not necessarily all such aspects, advantages, or novel features are necessarily achieved in accordance with any particular embodiment. Thus, embodiments described herein can be carried out in a manner that achieves or optimizes one or a group of advantages, aspects, or features as taught herein without necessarily achieving other advantages, aspects, or features as can be taught or suggested herein.

BRIEF DESCRIPTION OF THE DRAWINGS

These drawings and the associated description herein are provided to illustrate specific embodiments and are not intended to be limiting.

FIG. 2A shows an example layout of a VCO.

FIG. 2B shows an example layout of a VCO.

DETAILED DESCRIPTION

Figure 1:
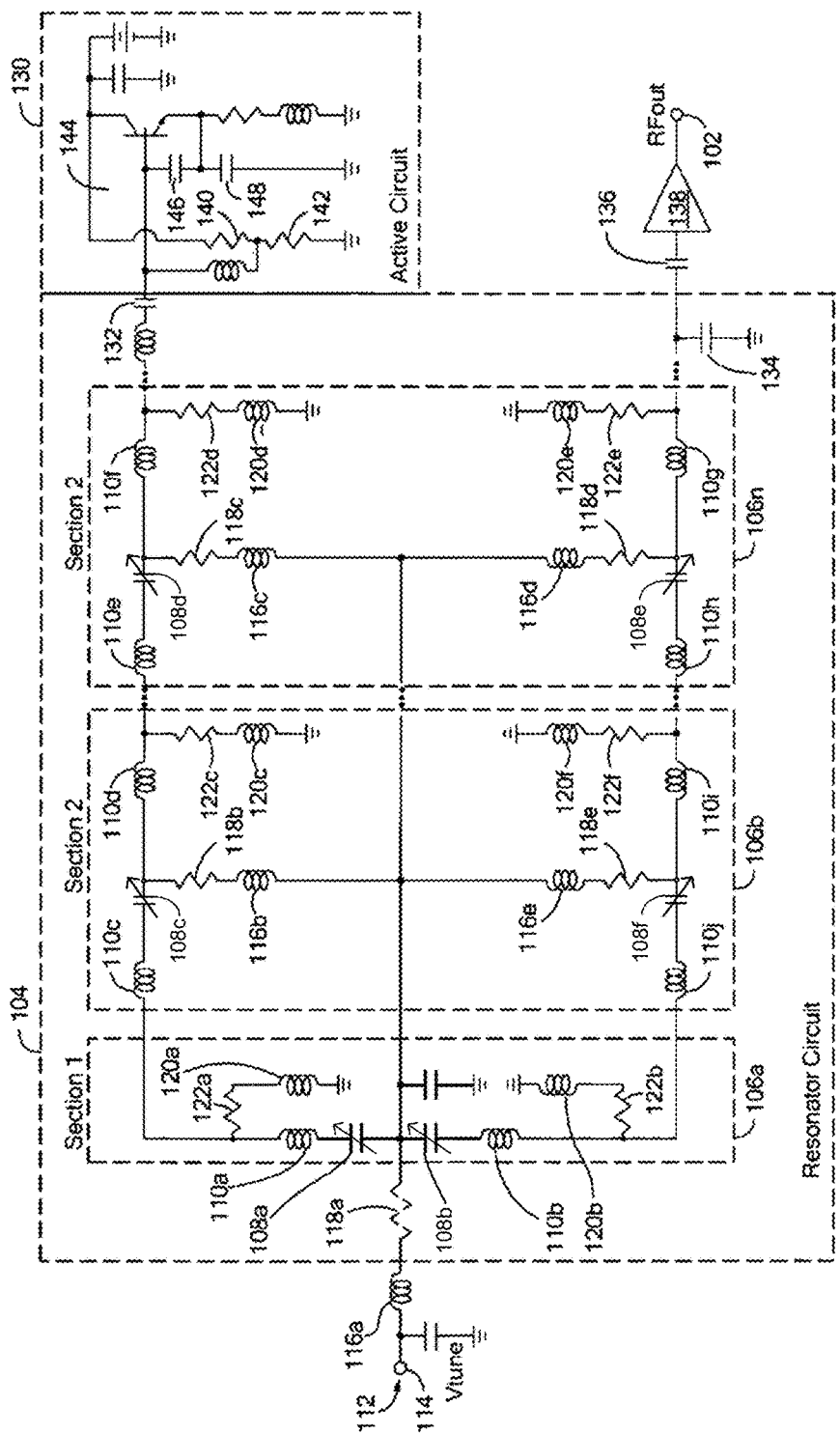
FIG. 1 shows an example circuit schematic of a voltage-controlled oscillator (VCO).

The following detailed description of embodiments presents various descriptions of specific embodiments of the invention. However, the innovations described herein can be embodied in a multitude of different ways as defined and covered by the claims. In this description, reference is made to the drawings in which like reference numerals may indicate identical or functionally similar elements. It will be understood that elements illustrated in the figures are not necessarily drawn to scale. Moreover, it will be understood that systems, apparatus, and electronic devices including one or more of the innovations discussed herein can include more elements than illustrated in a drawing and/or a subset of the elements illustrated in a drawing. Further, some embodiments can incorporate any suitable combination of features from two or more drawings. The headings provided herein are for convenience and do not necessarily affect the scope or meaning of the claims.

The performance of a voltage-controlled oscillator (VCO) (e.g., as shown in FIG. 1, FIG. 2A, and/or FIG. 2B) can be impacted by inductors (L) and capacitors (C) of the VCO, such as the inductors and capacitors used in an LC tank circuit of the VCO. The VCO can generate an output signal having a frequency that changes based on a control signal (such as the voltage of an input signal, a digital control signal, or other suitable control signal).

Figure 4A:
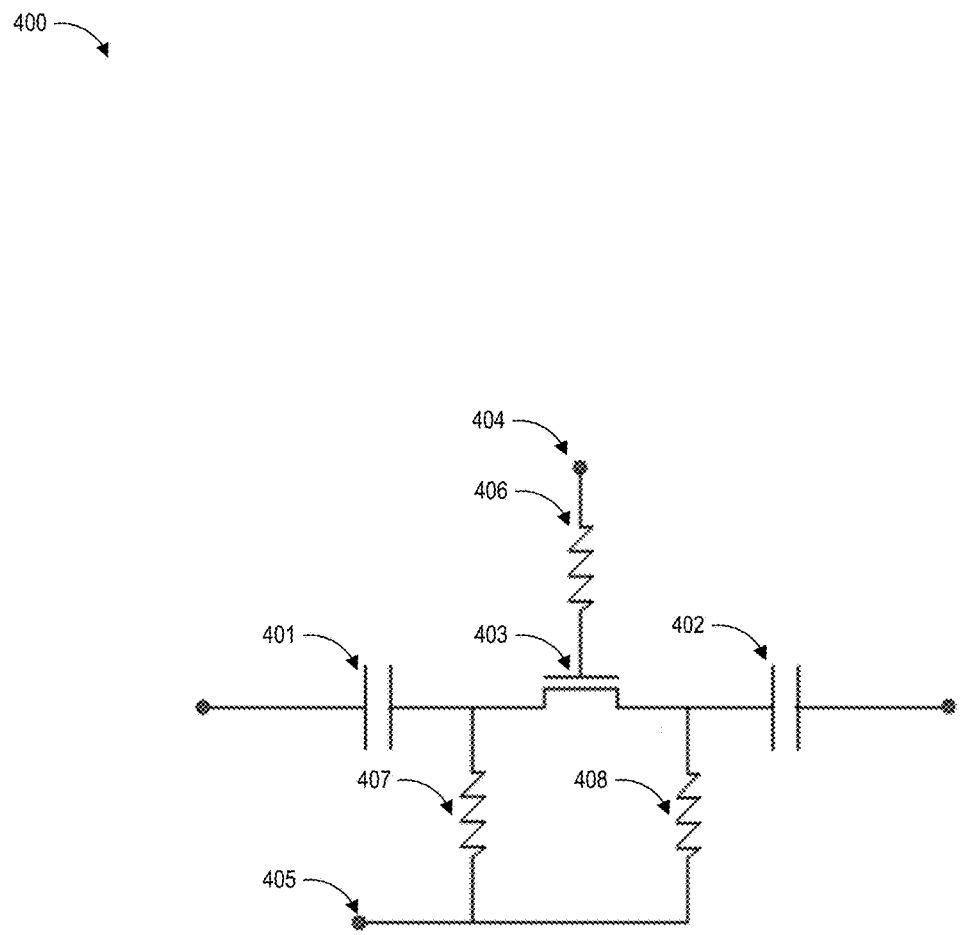
FIG. 4A shows an example schematic of a switched capacitor circuit.
Figure 4B:
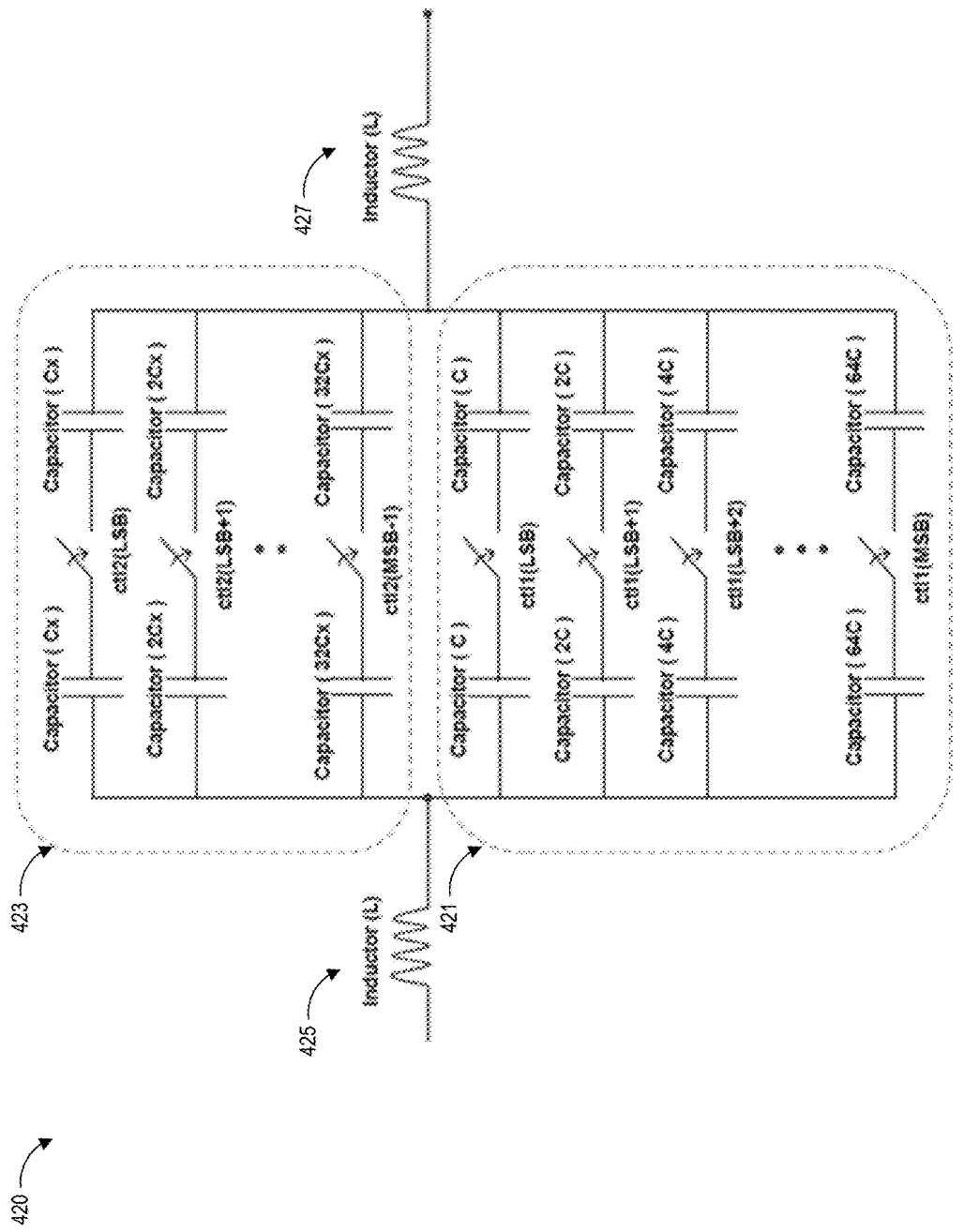
FIG. 4B shows an example schematic of two switched capacitor banks coupled to inductors.

It can be desirable for the frequency of the output signal to change linearly and monotonically with step changes in the control signal. A plurality of switched capacitor circuits (e.g., as described with reference to FIG. 4A) can be arranged in parallel in a first switched capacitor bank such that the capacitance of individual switched capacitor circuits can be selectively added to the effective capacitance provided by the first switched capacitor bank. A switched capacitor bank can be referred to as a switched capacitor array. A second plurality of switched capacitor circuits can be similarly arranged in a second switched capacitor bank. The second switched capacitor bank can be arranged in parallel with the first switched capacitor bank. The first and second switched capacitor banks can work together (e.g., as shown in FIG. 4B and/or FIG. 4C) to provide a range of effective capacitance values such that the VCO can generate an output signal that oscillates across a range of frequencies. The first switched capacitor bank can be used to adjust the oscillation frequency across the range of frequencies. The second switched capacitor bank can be used to adjust the oscillation frequency across a subset (e.g., about one half, about one quarter, about one eighth, about three quarters) of the range of frequencies over which the first switch capacitor bank adjusts the oscillation frequency.

A control signal can be used to operate the first switched capacitor bank. For example, the control signal can operate the switched capacitor bank according to a binary weighted control scheme where the switched capacitor circuits of the first switched capacitor bank are binary weighted, and bits of the control signal represent a binary weighting and are configured to activate a weighted individual switched capacitor circuit that corresponds with the binary weighting. The control signal can also be used to operate the second switched capacitor bank, except that the second switched capacitor bank can be activated when an appropriate bit (e.g., a most significant value/bit and/or an intermediate significance value/bit) is asserted. Using two switched capacitor banks can improve the linearity of the frequency changes in the VCO output signal. While the control signal may be described as a multi-bit binary signal for illustrative purposes, other suitable control signals can be used in accordance with the principles and advantages discussed herein.

A VCO can include one or more microstrip inductors in an LC tank circuit and/or elsewhere. The skin effect can cause high frequency (e.g., radio frequency and microwave frequency) current to dominantly flow through the outside skin depth of a conductor. The skin effect can apply to inductors, such as microstrip inductors. Due at least in part to the skin effect, separate components (e.g., two switched capacitor circuits) that are coupled to different parts of a microstrip inductor may receive varying amounts of current such that two equal capacitors can behave as though they have different capacitances. For example, capacitors coupled toward the outside of the inductor may receive more current than a capacitor coupled toward the middle.

Figure 7:
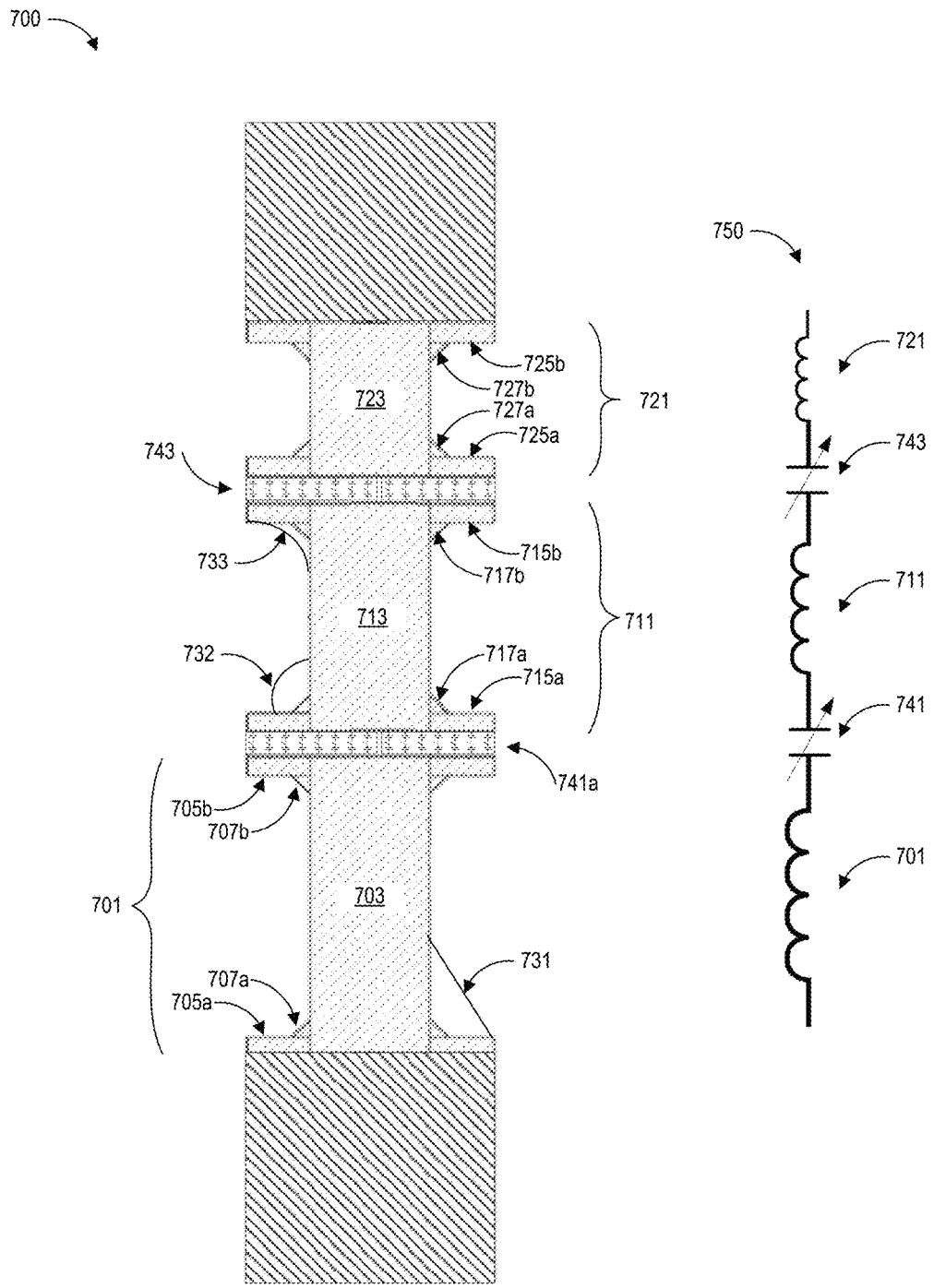
FIG. 7 shows an example layout view of chamfered microstrip inductors.
Figure 8:
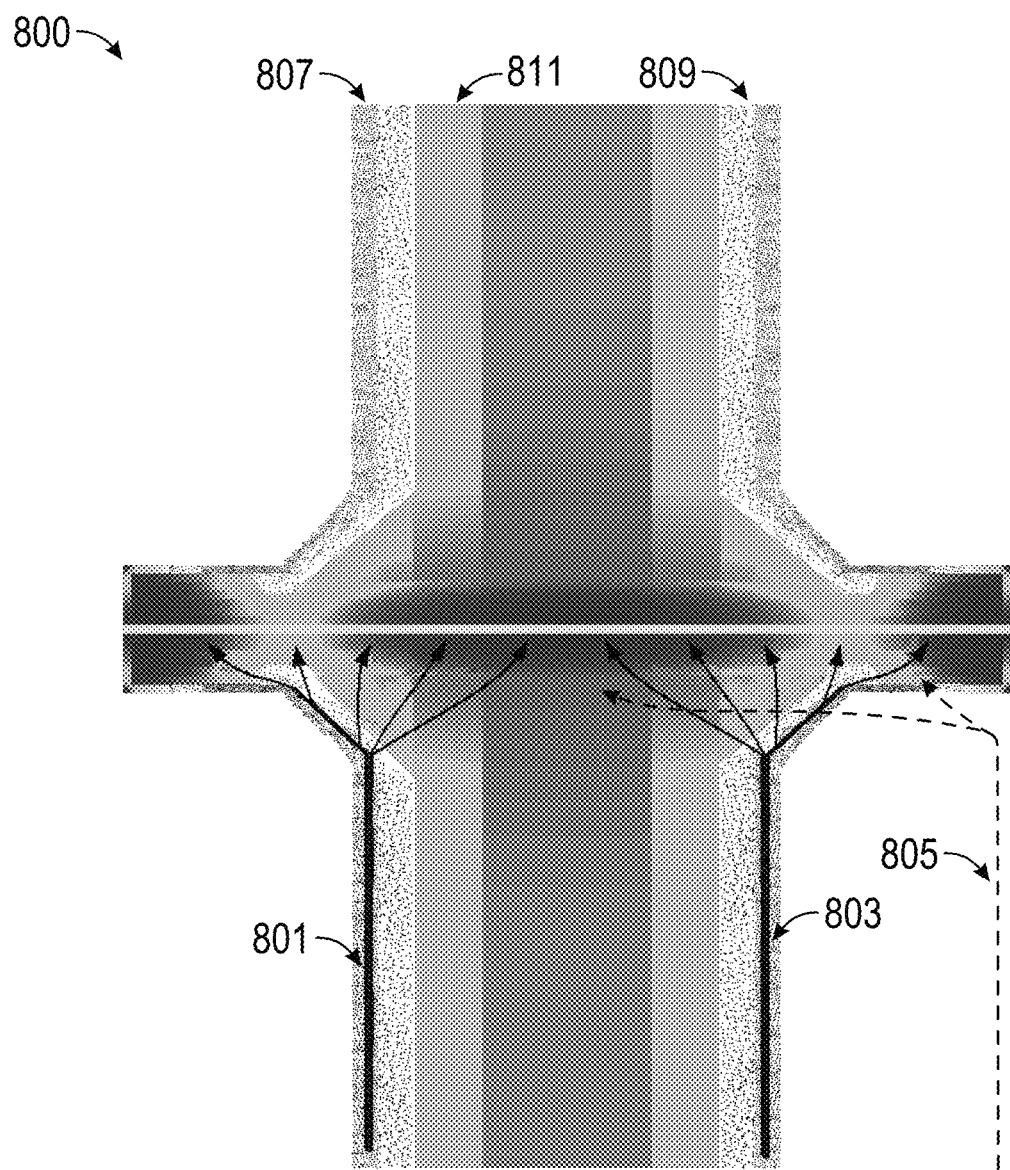
FIG. 8 shows an example heat map of current flow through a chamfered microstrip inductor.

It can be desirable to achieve a more even distribution of current. In some designs, the microstrip inductors can have an "I" shape, which is also sometimes referred to as a "dog-bone" shape. The microstrip inductor can have a body extending along one direction, and extensions at an angle (such as a perpendicular angle) from the body (e.g., as shown in FIG. 2B, FIG. 3B, FIG. 7, and/or FIG. 8). Where the extensions meet the body, a chamfered joint can be used to more evenly distribute current across the extension. This inductor design can more evenly distribute current to components coupled to different parts of the extension of the inductor (e.g., as shown in FIG. 8) relative to a rectangular shaped microstrip inductor.

Additional synergy can be gained from combining the designs of the switched capacitor banks and inductor (e.g., as shown in FIG. 3B). A design with both a first and second switched capacitor bank can involve a larger connection interface than a design with just the first switched capacitor bank. In some embodiments, the larger connection interface can be wider than the body of a microstrip inductor. The first and second switched capacitor banks can be coupled to the extension of the inductor. Due to the improved current distribution across the extension of the inductor, each switched capacitor circuit can receive a more evenly distributed current such that each unit of capacitance behaves more equivalently, even if the switched capacitors are coupled to different parts of the extension of the inductor. The combination of designs of the inductor and switched capacitor banks can make the output signal frequency changes in a VCO more monotonic.

The designs and techniques discussed herein can also be applied to other interfaces, such as an interface between a varactor and an inductor, an inductor and a plurality of resistors, etc. In accordance with the principles and advantages discussed herein, parasitic current paths can be reduced, the inductor or conductor can be less lossy, the phase noise of the VCO can be improved, or any combination thereof.

Voltage Controlled Oscillators

FIG. 1 shows an example layout level view 100 of a VCO. The VCO can be a step-tuned VCO. The VCO can also be a singled ended voltage controlled oscillator employing a series tuned Colpitts oscillator having a plurality of tunable resonators with variable capacitance and fixed inductance with reduced transistor current density and segmented transistor bank. Examples of VCOs are discussed in U.S. Pat. No. 8,957,738, issued Feb. 17, 2015, which is hereby incorporated by reference in its entirety.

Figure 3B:
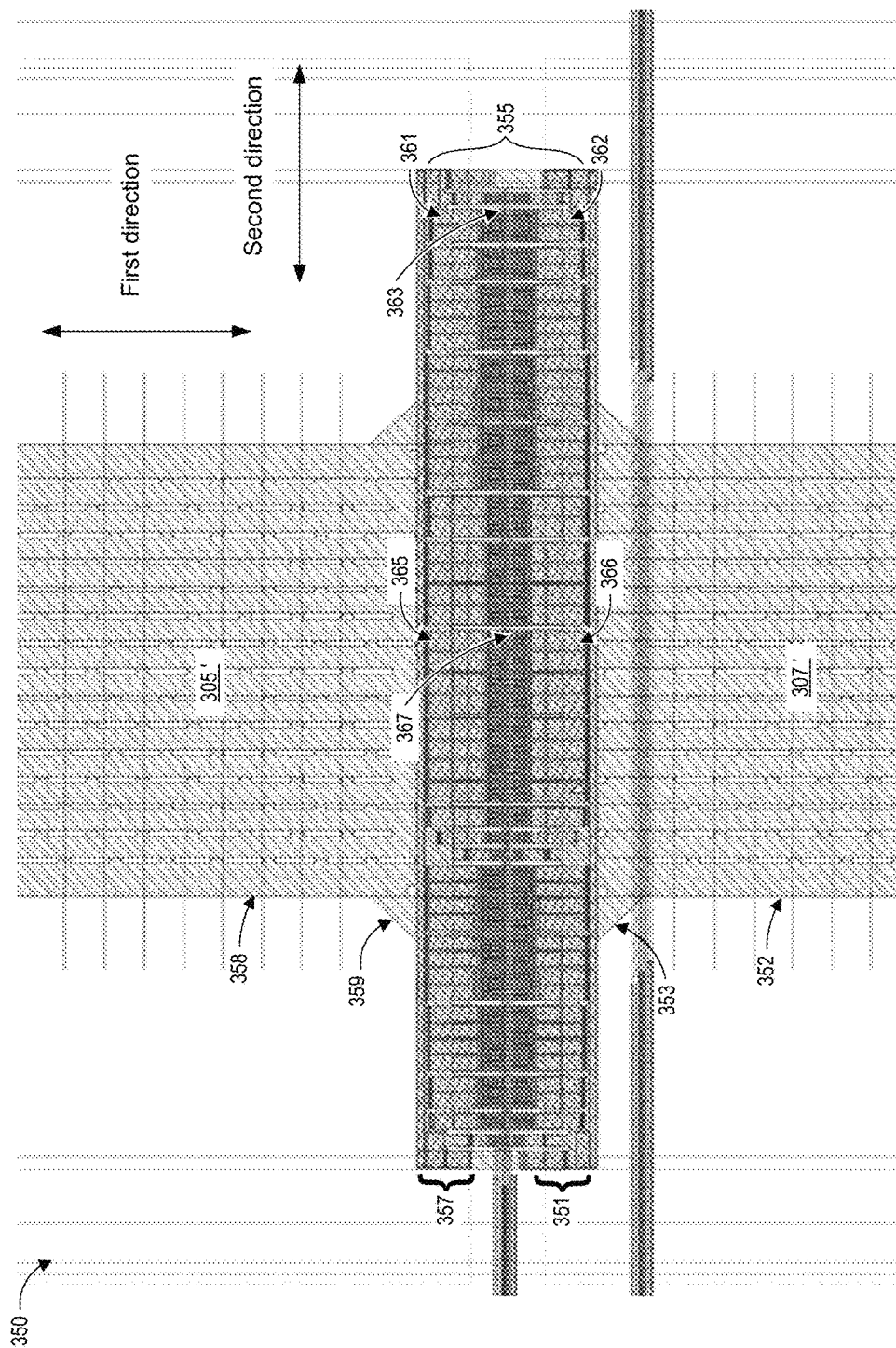
FIG. 3B shows an example layout view of chamfered inductors and a capacitor bank.
Figure 4C:
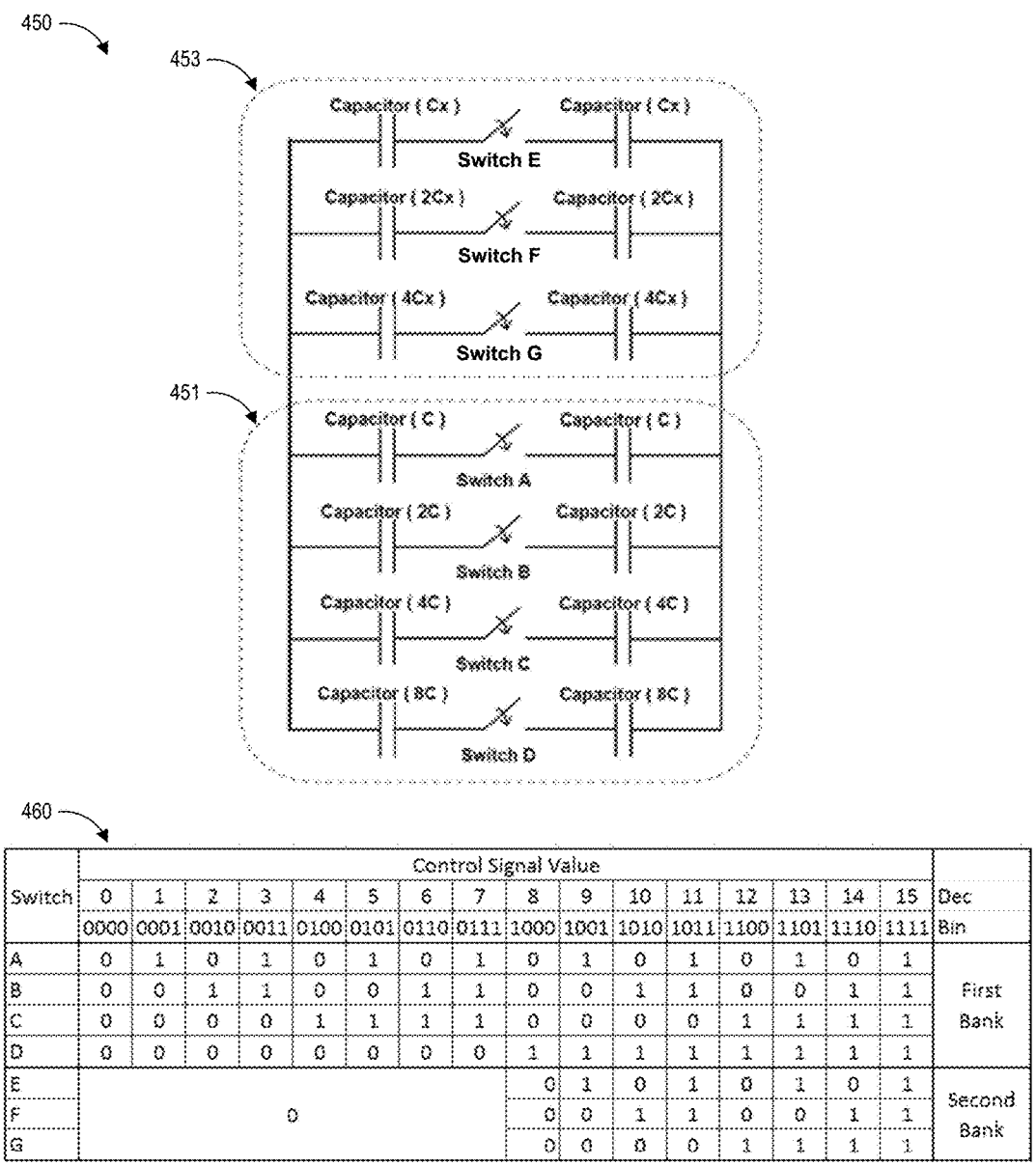
FIG. 4C shows an example schematic of two switched capacitor banks and a table representing a control scheme.

FIG. 1 includes a series tuned VCO 100, which provides wide bandwidth and good phase noise performance. It includes an output terminal 102 and a resonator circuit 104 including a plurality of at least two series resonators 106a-n. Each series resonator includes electrically tunable capacitances, such as variable capacitors 108a-f (which can be implemented as a plurality of switched capacitor banks, such as shown in FIG. 4B and FIG. 4C), and fixed inductors 110a-j (which can be implemented as the inductors shown in FIG. 3B, FIG. 7, and FIG. 8). Inductors 110a-j may be implemented as relatively short transmission lines. A direct current (DC) control circuit 112 includes a frequency control terminal 114 and an inductance 116a-e and may include resistance 118a-e coupled in series between the frequency control terminal 114 and each pair of resonating variable capacitors 108a-f. DC control circuit 112 also includes inductance 120a-f and a resistance 122a-f which provide a DC voltage reference for variable capacitors 108a-f. Coupling between resonant circuit 104 and active circuit 130 can be controlled by capacitance 132. Capacitance 134 can provide a relatively low impedance point to sample the voltage controlled oscillator output 102 through capacitance 136. An optional buffer amplifier 138 may be used to isolate resonant circuit 104 from the output 102. Resistors 140, 142 set the base current for the active device 144 and thus the oscillator operating current. Feedback capacitances 146 and 148 determine the active circuit 130 negative resistance characteristics.

Any of the capacitors in the resonator circuit 104 or elsewhere can be, for example, implemented as one or more switched capacitor banks described herein, such as shown in FIG. 4B and FIG. 4C. Any of the inductors in the resonator circuit 104 or elsewhere can be, for example, implemented as the chamfered microstrip inductors with extensions described herein, such as shown in FIG. 3A, FIG. 3B, FIG. 7, and FIG. 8. For example, a chamfered microstrip inductor can be physically adjacent to and electrically connected to a switched capacitor bank. In some embodiments, the VCO is configured to generate a signal having a steppable frequency ranging from about 7 GHz to about 14 GHz. In some embodiments, the VCO can be coupled to a frequency divider to divide the frequency by 1, 2, 4, 8, 128, or other number, such that the output frequency of the system can range from about one megahertz to about 14 GHz. In some embodiments, the VCO can be integrated with a phase locked loop (PLL).

FIG. 2A and FIG. 2B show example layout views 200, 250 of a VCO. FIG. 2A shows a first block 201 including connections for step-tune switch signals, a VG signal that can be used to bias gate voltage (e.g., the switch control node 404 as shown in FIG. 4A) or the source and/or drain voltage (e.g., the switch bias node 405 as shown in FIG. 4A) to turn the MOS switch 403 on or off, an analog ground signal, and a VDD rail; a PLL buffer 203; a third block 205 including a serial peripheral interface (SPI), digital controller, and a buffer; a fourth block 207 for VG; a first VCO core 209; a second VCO core 211; a coupler 213; a first RF output buffer 215; a second RF output buffer 217; a divider and amplifier 219; an RF output multiplexor switch 221; a bandgap and voltage tuner 223; and connections for the tuning voltage signal, analog ground signal, VDD, RF Ground, and VCC rail.

The layout view 250 shows details of the first and second VCO cores 209, 211. Varactors 251, 253, 255, and 257 are coupled to the top and bottom ends of the VCO cores as shown in the layout. The VCO core 211 is labeled with inductors 261, 263, 265, 267, 269, and 271. The VCO core 209 has similar sections but are not labeled in FIG. 2B. A plurality of switched capacitor banks are between each adjacent inductor 261, 263, 265, 267, 269, and 271. A close up view of two inductors and a plurality of capacitor banks is shown in FIG. 3B. Another view of the inductors is shown in FIG. 7.

Example Arrangements and Layouts of Inductors and Capacitors

Figure 3A:
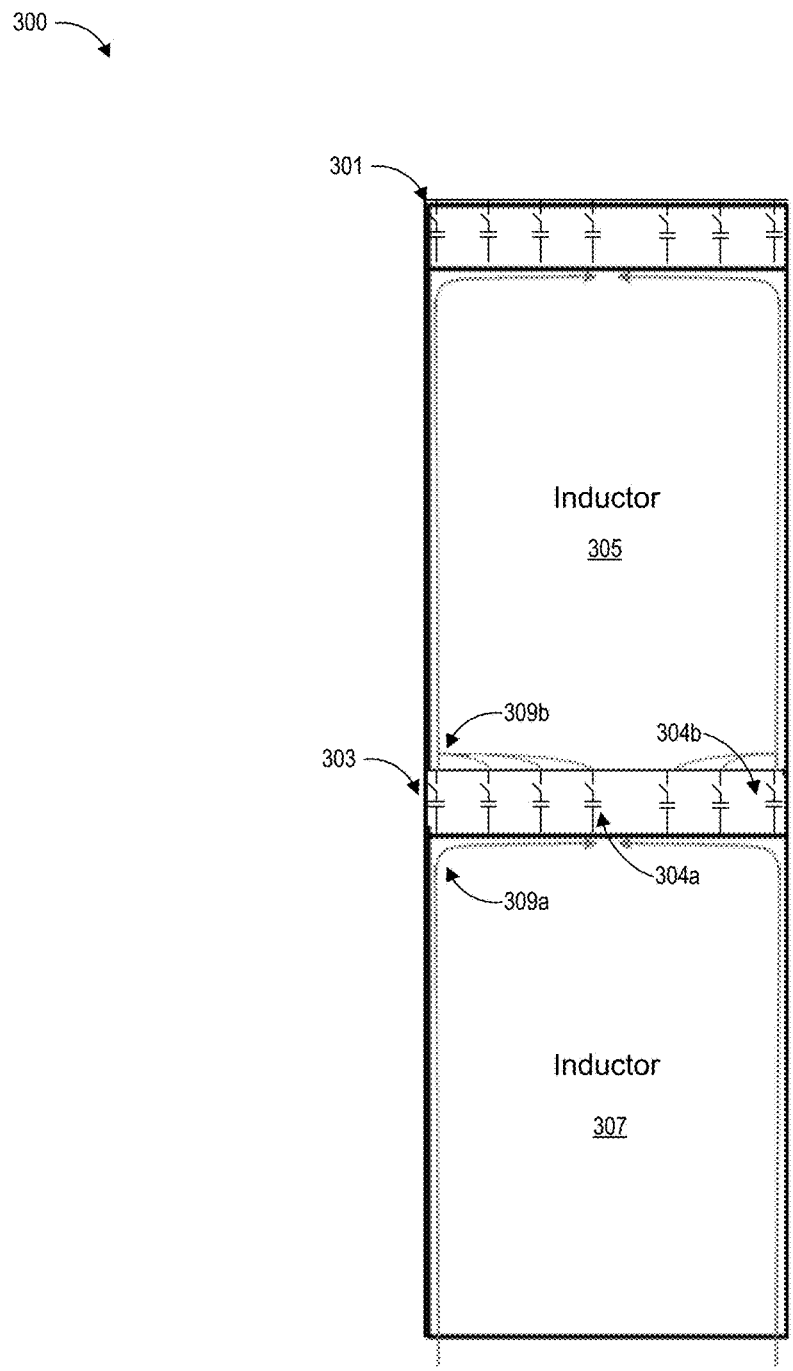
FIG. 3A shows an example arrangement of inductors and a plurality of capacitor banks.

FIG. 3A shows an example arrangement 300 of inductors and a plurality of switched capacitor banks. The arrangement 300 includes a plurality of switched capacitor banks 301, a plurality of switched capacitor banks 303, an inductor 305, and an inductor 307. The flow of current through the inductor 307 to the plurality of switched capacitor banks 303 is illustrated with the lines 309a, and the continuing flow of current from the switched capacitor banks 303 through the inductor 305 to the plurality of switched capacitor banks 301 is illustrated with the lines 309b. Switched capacitor bank 303 includes switched capacitor circuits 304a and 304b. In some embodiments, switched capacitor circuits of either or both of the of the switched capacitor banks 301 and 303 can be implemented as the example arrangement shown in FIG. 4A.

In some embodiments, the inductors 305 and 307 can be microstrip inductors. Microstrip lines or other components can be referred to as inductors in designs where the component is used for or designed for its inductive property, or if inductance is a primary property (e.g., as opposed to a parasitic property). A microstrip line (or any transmission line) has an inductance per unit length and can be used as an inductor. For relatively short lengths, inductance can be the dominant electrical property of a transmission line or microstrip line. For comparison with the inductors 305 and 307, other inductors having different (e.g., dog-boned) shapes are shown in FIG. 3B, FIG. 7, and FIG. 8.

In FIG. 3A, the plurality of switched capacitor banks 301 can include two or more switched capacitor banks, for example, as shown in FIG. 4B and FIG. 4C. The plurality of switched capacitor banks 303 can also include two or more switched capacitor banks, for example, as shown in FIG. 4B and FIG. 4C. Each switched capacitor bank can include a plurality of switched capacitor circuits, such as a capacitor and a switch in series as shown in FIG. 3A, the series capacitor-switch-capacitor circuit shown in FIG. 4A, FIG. 4B, and FIG. 4C, a switch-capacitor-switch circuit, or other similar designs.

Referring to FIG. 3A, a current indicated by line 309a can flow primarily toward the outside of the inductor 307 due to the skin effect. The current 309a can flow through a first distance (e.g., approximately the length of the inductor 307) to reach switched capacitor circuit 304b that is coupled toward the outside of the inductor 307. To reach switched capacitor circuit 304a that is coupled toward the middle of the inductor 307, the current 307 flows along a longer distance (e.g., approximately the length of the inductor 307 plus about half of the width of the inductor 307). The difference in lengths of current flow can cause switched capacitor circuits 304a and 304b to behave as though connected to different lengths of inductor.

Other inductor designs disclosed herein (e.g., as shown in FIG. 3B, FIG. 7, and FIG. 8) can be used to more uniformly distribute current to the various capacitors in the plurality of switched capacitor banks 303 independent of whether the switched capacitor circuits are coupled toward the middle or toward the edge of the inductor 307, such that each unit of capacitance behaves more equivalently relative to rectangular shaped microstrip inductors 305 and 307 shown in FIG. 3A. The current indicated by line 309b continues from the plurality of switched capacitor banks 303 and flows toward the outside of the inductor 305 to the plurality of switched capacitor banks 301. The inductor designs disclosed herein can be used to more uniformly distribute current from the inductor 305 to the various switched capacitor circuits in the plurality of switched capacitor banks 301.

FIG. 3B shows an example arrangement 350 of chamfered inductors and a plurality of capacitor banks. The example arrangement 350 provides a layout view of the section indicated in FIG. 3A, but the example in FIG. 3B is not identical to the section in FIG. 3A. The arrangement can be implemented for features shown in FIG. 1, such as for inductor 110c, variable capacitor 108c, and inductor 110d. The arrangement can also be implemented in FIG. 1 for inductor 110e, variable capacitor 108d, and 110f; inductor 110j, variable capacitor 108f, and 110i; or inductor 110h, variable capacitor 108e, and 110g.

In FIG. 3B, the arrangement 350 shows inductor 307' that includes a body 352, an extension 351, and a chamfered joint 353 where the extension 351 joins the body 352. The layout view also shows inductor 305' that includes a body 358, an extension 357, and a chamfered joint 359 where the extension 357 joins the body 358. Inductors 305' and 307' shown in FIG. 3B have modified dog-boned shapes compared to the rectangular strip shaped inductors 305 and 307 shown in FIG. 3A. A plurality of switched capacitor banks 355 is coupled across different parts of the extension 351 of the inductor 307' and also coupled across different parts of the extension 537 of the inductor 305'. The plurality of switched capacitor banks 355 include a plurality of switched capacitor circuits that include a first switched capacitor circuit and a second switched capacitor circuit. The first switched capacitor circuit includes capacitors 361, 362 and a switch 363. The second switched capacitor circuit includes capacitors 365, 366 and a switch 367.

The body 352 of the first inductor 307' extends along a first direction. The extension 351 of the first inductor 307' extends along a second direction that is at an angle (90 degrees) from the first direction. In other embodiments, the extension 351 can extend at a different angle (e.g., 45 degrees). Although the extension 351 is shown as being a rectangular shape in plan view, in other embodiments, the extension can have other shapes (e.g., curved, V-shaped, concave, convex, oval, round, polygonal).

A plurality of chamfered joints, including joint 353, join the body 352 and the extension 351 of the first inductor. The chamfered joint 353 is shown with a shape of a right triangle, but can be other shapes in other embodiments. For example, the straight hypotenuse of the right triangle can be replaced with a curved hypotenuse, or the chamfered joint can be in the shape of a quarter of a circle or polygon. The chamfered joint 353 can be of the same conductive material and in the same metal or routing layer as the body 352. In some other instances, the chamfered joint 353 can be made of a different material or in a different metal or routing layer than the body 352.

A plurality of switched capacitor banks 355 are coupled between the extensions 351 and 357 of the inductors 305' and 307', respectively. Examples of a plurality of switched capacitor banks are further discussed with respect to FIG. 4B and FIG. 4C. The plurality of switched capacitor banks 355 can each include a plurality of switched capacitor circuits that are coupled in parallel. The switched capacitor circuits are connected to different parts of the extensions 351 and 357. For example, some switched capacitor circuits (e.g., the first switched capacitor circuit including capacitors 361, 362) are coupled toward the outside of the extensions 351 and 357, while other switched capacitor circuits (e.g., the second switched capacitor circuit including capacitors 365, 366) are coupled toward the middle of the extensions 351 and 357.

The second inductor 305' includes a body 358 along a first direction that is coupled to an extension 357 that extends along a second direction that is at a non-zero angle from the first direction, similar to how the body 352 and extension 351 of the first inductor are arranged. The second inductor 305' also includes chamfered joints, such as chamfered joint 359.

The plurality of switched capacitor banks 355 is wider than the bodies 352, 358 of the inductors 307', 305'. The extensions 351, 357 can be wider that the bodies 352, 358, and the extensions 351, 357 can be sufficiently wide to provide an interface for the plurality of switched capacitor banks 355.

Switched Capacitor Circuits and Switched Capacitor Banks

Some VCOs have a single switched capacitor bank coupled between two inductors, and switches in the single switched capacitor bank can be turned on to increase the total capacitance of the switched capacitor bank to increase the capacitance of the VCO's LC tank circuit, which can decrease the resonance frequency of the LC tank circuit. As more switches are turned on, the steps changes in resonance frequency can become smaller due to relatively large parasitic capacitance. In other words, the tuning capability can diminish as a more switches in the single switched capacitor bank are turned in. This can make it difficult to implement a wide-band tuning VCO without compromising other VCO performance characteristics, such as phase noise.

In the designs disclosed herein, a plurality of switched capacitor banks can be used in place of the single switched capacitor bank. Control bits of a first switched capacitor bank can start from a most significant bit (MSB), control bits of a second switched capacitor bank can start from the next MSB (e.g., MSB-1), control bits of a third switched capacitor bank can start from MSB-2, and so on. For example, if the first switched capacitor bank has 7 bits of control switches configurable from steps 0 to 127 in decimal, then the second switched capacitor bank can have 6 bits of control switches configurable from steps 64 to 127 in decimal. Both switched capacitor banks can be superimposed together from steps 64 to 127 in decimal, where step 0 in decimal gives the highest tuning frequency and step 127 in decimal gives the lowest tuning frequency. Also, a third switched capacitor bank can start from step 96 in decimal and continue through step 127 in decimal.

The second switched capacitor bank can start at any control bit bigger than the first switched capacitor bank in decimal (e.g., if the first switched capacitor bank starts at decimal step 0, then the second switched capacitor bank can start at decimal step 1 or greater). A third switched capacitor bank can start at any control bit bigger than the second switched capacitor bank (e.g., if the second switched capacitor starts at decimal step 1, then the third switched capacitor bank can start at decimal step 2 or greater).

For each additional switched capacitor bank, the capacitor sizes and switch transistors can be individually optimized depending on a relevant subset of a tuning frequency band (e.g., corresponding to steps 64-127) instead of being optimized to cover a whole tuning band (e.g., corresponding to steps 0-127). Such optimization can reduce total parasitic capacitance compared to a single switched capacitor bank and the VCO can have more linear frequency changes in response to each tuning step. The VCO can have wide band tuning without compromising dynamic performance such as phase noise. The VCO can also have a relatively constant frequency tuning range over different tuning voltages.

FIG. 4A shows an example schematic of a switched capacitor circuit 400. The illustrated switched capacitor circuit 400 includes a first capacitor 401, a second capacitor 402, a switch 403, a switch control node 404, a switch bias node 405, a first resistor 406, a second resistor 407, and a third resistor 408.

The first capacitor 401 and second capacitor 402 can be coupled on opposite sides of a switch 403. A switched capacitor circuit that includes first and second capacitors 401 and 402, respectively, in series with the switch 403 can have improved signal integrity in some high frequency applications relative to a single capacitor in series with a switch. In some other designs, one capacitor can be used in a switched capacitor circuit.

The switch 403 can be a field effect transistor (FET), such as a metal oxide field effect transistor (MOSFET), or any other suitable type of switch. A control voltage applied to the switch control node 404 can cause the transistor to turn on or off and act as a closed or open switch, respectively. A bias voltage can be applied to the switch bias node 405 to provide bias for the input and output nodes of the switch 403. Resistors 406, 407, and 408 can have appropriate resistance values for biasing the switch 403.

The switched capacitor circuit 400 can be represented with a functionally equivalent circuit of a capacitor, switch, and capacitor coupled in series, such as shown in FIG. 4B and FIG. 4C.

FIG. 4B shows an example schematic of an LC circuit 420 that includes two switched capacitor banks coupled to inductors. The LC circuit 420 includes inductors 425 and 427, a first switched capacitor bank 421, and a second switched capacitor bank 423. The first switched capacitor bank 421 is coupled in parallel between the two inductors to the second switched capacitor bank 423.

The first switched capacitor bank 421 includes a plurality of switched capacitor circuits arranged in parallel. Each switched capacitor circuit includes a capacitor, a switch, and a capacitor coupled in series. In some instances, (not illustrated in FIGS. 4B and 4C), a static capacitor can be coupled in parallel with the switched capacitance circuits to provide capacitance when all of the switches of the switched capacitance circuits are off.

In the example shown in FIG. 4B, the first switched capacitor bank 421 includes seven switched capacitor circuits. Each of the seven switched capacitor circuits includes binary weighted capacitors. As shown, the first switched capacitor circuit has capacitors of "C" capacitance, the second switched capacitor circuit has capacitors of "2C" capacitance, the third switched capacitor circuit has capacitors of "4C" capacitance, and so on, and the last switched capacitor circuit has capacitors of "64C" capacitance. The total series capacitance of the first switched capacitor circuit that has two capacitors of capacitance C is C/2 due to how capacitance adds in series. In other examples, the first switched capacitor bank 421 can include any integer number of switched capacitor circuits that is at least 2 (e.g., 2, 4, 5, 8, 10, 16, 20, 30, 32, 50, 64, 100, or 128).

A first control signal "ctrl1" can be used to activate the switches in the first capacitor bank 421. In the example shown in FIG. 4B, the first control signal ctrl1 has seven bits—one bit for each switched capacitor circuit. The first control signal ctrl1 can be used according to the binary control scheme to cause the capacitances of different switched capacitor banks to be added to the effective capacitance of the first switched capacitor bank 421 by closing a switch, thereby decreasing the resonant frequency of the LC tank circuit. A least significant bit (LSB) of the first control signal ctrl1 can be used to activate or deactivate the switch in the switched capacitor circuit having the smallest capacitors of capacitance C. A most significant bit (MSB) of the first control signal ctrl1 can be used to activate or deactivate the switched in the switched capacitor circuit having the largest capacitors of capacitance 64C.

A second switched capacitor bank 423 can include the same number of or fewer switched capacitor circuits than the first switched capacitor bank 421. In the example shown in FIG. 4B, the second switched capacitor bank 423 includes six switched capacitor circuits, which is one fewer switched capacitor circuit compared to the first switched capacitor bank 421. Each of the six switched capacitor circuits in the second switched capacitor bank 423 includes binary weighted capacitors from "Cx" to "32Cx." In other examples, the second switched capacitor bank 423 can include any integer number of switched capacitor circuits that is at least 1 (e.g., 1, 2, 4, 5, 8, 10, 16, 20, 30, 32, 50, 64, 100, or 128) up to or less than the number of switched capacitor circuits in the first switched capacitor bank 421.

A second control signal "ctrl2" can be used to activate the switches in the second capacitor bank 423. In the example shown in FIG. 4B, the second control signal ctrl2 has six bits—one bit for each switched capacitor circuit. The second control signal ctrl2 can be used according to the binary control scheme to cause the capacitances of different switched capacitor circuits to be added to the effective capacitance of the second switched capacitor bank 423. A least significant bit (LSB) of the second control signal ctrl2 can be used to activate or deactivate the switch in the switched capacitor circuit having the smallest capacitance Cx. A most significant bit (MSB) of the second control signal ctrl2 can be used to activate or deactivate the switched in the switched capacitor circuit having the largest capacitance 32Cx.

The second control signal ctrl2 can be a separate signal from ctrl1, or the second control signal can be derived from ctrl1. For example, the second control signal ctrl2 can be the same bits as ctrl1 without the MSB, except that each bit in ctrl2 is ANDed with the MSB of ctrl1. In some instances, the second control signal ctrl2 can include a subset of the bits of the first control signal ctrl1 and the switches of the switched capacitor circuits can be biased (e.g., by applying a bias signal to bias node 404 of the switched capacitor circuit 400 of FIG. 4A) such switches do not turn on for a particular value of the bit(s) of the first control signal ctrl1 that is not included in the second control signal ctrl2.

In other examples, the capacitances of the capacitors are not necessarily binary weighted and can be weighted according to any other suitable scheme. For example, in order to compensate for an effective capacitance difference between switched capacitor circuits at different locations (such as switched capacitor circuits 304a and switched capacitor circuit 304b shown in FIG. 3A) due to different resonant current paths, each capacitor could have a compensatory capacitance added to a binary weighted value or any other weighted value or suitable scheme. In some embodiments, the capacitances can all be the same, or the capacitances can linearly increase (C, 2C, 3C, 4C . . . ) or change according to a different function. The control scheme can also be different based on the different capacitor weightings. In some embodiments, the capacitance values C and Cx can be the same or substantially similar. For example, the ratio of C to Cx can be any suitable ratio, such as 1:1, 1:1.5, 1:2.1, 1:2.9, etc. The ratio Cx to C can be defined to implement any desired total frequency transfer characteristics. As an example, for the linear transfer characteristic curve shown at FIG. 5B, the ratio Cx/C is chosen to be between 1:1 and 4:1. In some embodiments, the ratio of Cx/C is relatively close to 2:1. In some embodiments, the capacitance value Cx can be less than the capacitance value C. In some embodiments, the capacitance value Cx can be larger than the capacitance value C. Some embodiments can include a plurality of switched capacitor banks, such as a first switched capacitor bank based on multiples of "C," a second switched capacitor bank based on multiples of "Cx," a third switched capacitor bank based on multiples of "Cy," and a fourth switched capacitor bank based on multiples of "Cz."

FIG. 4C shows an example schematic of switched capacitor banks 450 and a table 460 representing a control scheme. A first switched capacitor bank 451 has four switched capacitor circuits with capacitors of capacitance C, 2C, 4C, and 8C and switches A through D, respectively. A second switched capacitor bank 453 has three switched capacitor circuits with capacitors of capacitance Cx, 2Cx, and 4Cx and switches E through G, respectively.

The control table 460 shows an example of how a 4-bit control signal can be used to control the first and second switched capacitor circuits. In the control table, a "1" indicates that a switch is closed (e.g., a transistor is turned on), and a "0" indicates that a switch is open (e.g., a transistor is turned off).

For the first switched capacitor bank 451, switch A is controlled by the LSB of the control signal (referred to as control signal[0]), switch B is controlled by control signal [1], switch C is controlled by control signal[2], and switch D is controlled by the MSB of the control signal (referred to as control signal[3]). The switched capacitor circuits are controlled according to a binary weighted control scheme and cover the full range of control signal values from 0 to 15. A VCO including the first switched capacitor bank 451 can adjust 16 different steps based on the first switched capacitor bank, and the VCO can have an output signal within 16 different frequency bands.

The switched capacitor circuits in the second switched capacitor bank 453 can be disabled for control signal values 0-7 or 0-8. Beginning at control signal value 8, switch E is controlled by the LSB of the control signal (control signal [0]), switch F is controlled by control signal[1], and switch F is controlled by control signal[2]. Equivalently, it can be expressed that for all control values, switch E is controlled by the boolean operation AND(control signal[3], control [0]), switch F is controlled by the boolean operation AND (control signal[3], control[1]), and switch G is controlled by the boolean operation AND(control signal[3], control[2]). In an alternative control-equivalent design, switches E, F, and G can be configured to operate based on control signals[0], [1], and [2] respectively, and one or more separate switches (not shown) based on control signal [3] can be coupled in series with the second switched capacitor bank 453 to couple or decouple the second switched capacitor bank 453.

Although there are seven total switched capacitor circuits in the switched capacitor banks 450, only a four bit control signal is used. Each of the four bits is used to control one of the switched capacitor circuits in the first switched capacitor bank 451. Three of the four bits are used to control one of the switched capacitor circuits in the second switched capacitor bank 453 when the MSB of the control signal is asserted. An effect of the control scheme is that the first switched capacitor bank 451 operates across the 0-15 range of control signal values, while the second switched capacitor bank 453 operates across about half (8-15 or 9-15) of the range of control signal values.

Some embodiments can include different numbers of switched capacitor circuits that turn on across different ranges. For example, some embodiments can include a 4-bit switched capacitor bank that operates across steps 0-15, a second 3-bit switched capacitor bank that operates across steps 9-15, and a third 3-bit switched capacitor bank that operates across steps 10-15. Some embodiments can include a 4-bit switched capacitor bank that operates across steps 0-15, a second 2-bit switched capacitor bank that operates across steps 9-12, and a third 2-bit switched capacitor bank that operates across steps 12-15. Embodiments of this disclosure can include a first switched capacitor bank that operates across a range of steps, and a supplemental switched capacitor bank configured to make the capacitance changes more proportional at the higher step frequencies.

In various embodiments, a multiple switched capacitor bank design can include a first switched capacitor bank configured to operate across a range of steps determined by a control signal, a second switched capacitor bank that starts from the MSB of the control signal, a third switched capacitor bank that starts from the next MSB of the second switched capacitor bank (e.g., MSB-1 of the control signal of the first switched capacitor bank), and so on.

The sizes of capacitors and switch transistors in each bank can be individually designed and/or optimized depending on its relative tuning frequency band instead of for covering an entire frequency band. Such optimization can reduce the total parasitic capacitance compare to a single switched capacitor design and provides more linear frequency tuning over the whole tuning frequency band. Accordingly, a wide-band VCO can be designed without employing multiple narrow-band VCO's. Using fewer cores for fewer VCO bands can also reduce chip area.

The capacitance in an LC tank circuit can affect the output frequency of an output signal generated by a VCO. The VCO can receive an input signal and generate a control signal based at least in part on the voltage of the input signal. The control signal can be used to adjust the effective capacitance of a plurality of switched capacitor banks. In a VCO where each control signal value causes the VCO to generate an output signal having a different frequency, the first switched capacitor bank 451 operates across the whole VCO output frequency range while the second switched capacitor bank 453 operates only across about half of the VCO output frequency range.

The circuits and control scheme shown in FIG. 4B and FIG. 4C can be used to adjust an effective capacitance of a variable capacitance circuit that includes two or more switched capacitor banks. One or more first switched capacitor circuits in the first switched capacitor banks can be switched to adjust the effective capacitance independent of the switched capacitor bank for a range of steps (e.g., steps 0 to 7). One or more second switched capacitor circuits in the second switched capacitor bank and at least one of the first switched capacitor circuits can be switched, thereby adjusting the effective capacitance using both the first switched capacitor bank and using the second switched capacitor bank for a second range of steps (e.g., for steps 8-15). In some embodiments, switched capacitor can be used in an LC tank circuit to affect an output frequency of a VCO. An input voltage to a VCO can be used to generate a control signal, such as with an analog to digital converter.

Graphs of Frequency Output

Figure 5A:
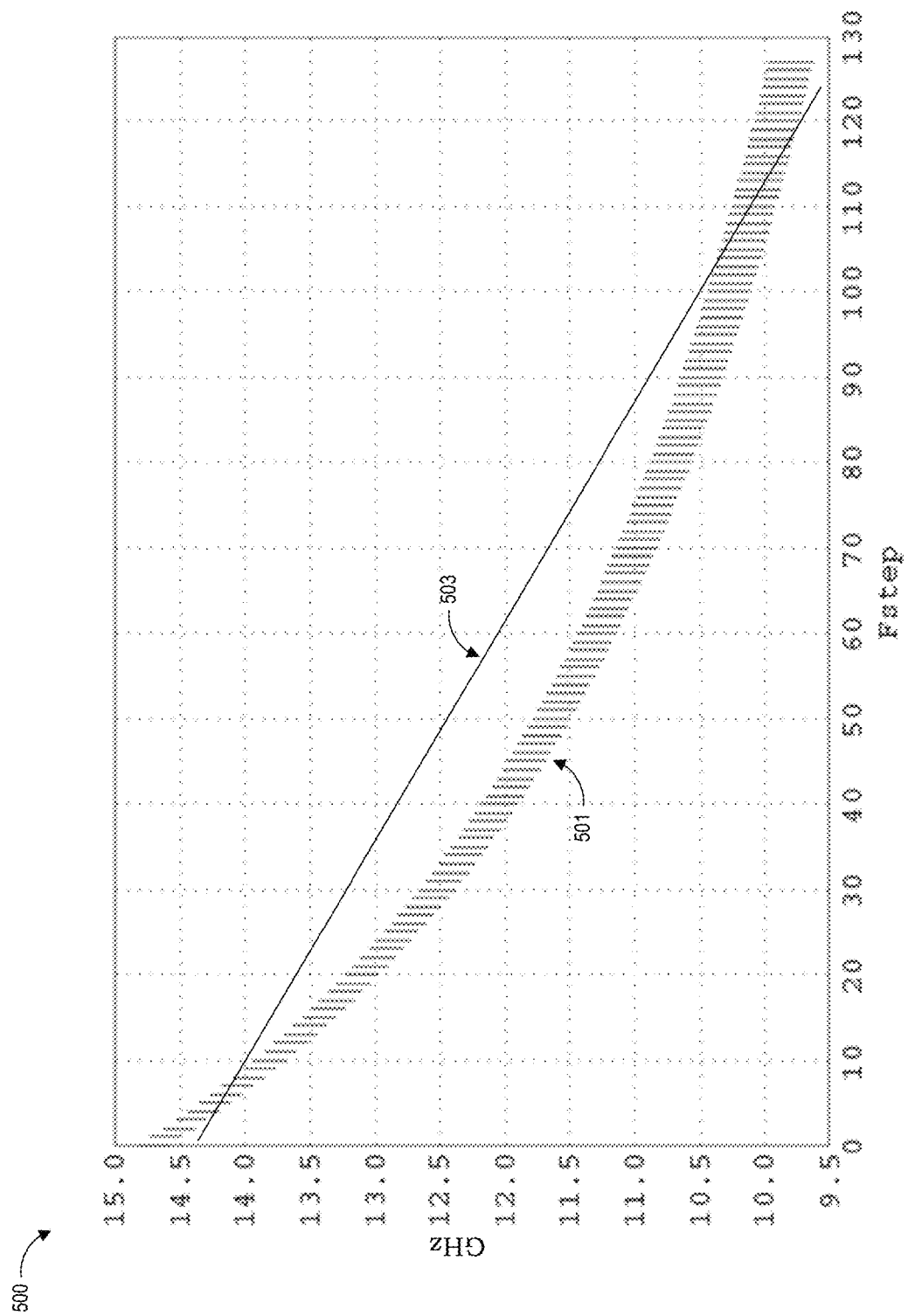
FIG. 5A shows an example graph of frequency output ranges per step for a VCO having a single capacitor bank that responds to step control signals.

FIG. 5A shows an example graph 500 of frequency output ranges per step for a VCO having a single capacitor bank that responds to a step control signal. The y-axis shows the output frequency of the VCO output signal in gigahertz (GHz). The x-axis shows a frequency step (e.g., a control signal value). A plurality of vertical lines 501 indicates a range of frequency values that can be output by the VCO for each selected step. Some VCO's can be tuned or calibrated (e.g., with a varactor)—the frequency range covered by each vertical line indicates a possible tuning or calibration range, such as for manufacturing variations, temperature changes, etc. A straight, monotonically decreasing line 503 is drawn as a reference.

The graph 500 shows that the changes in frequency are not monotonically decreasing throughout the entire illustrated range of frequency steps. For example, when stepping from step 0 to step 10, the output frequency decreases much faster than when stepping from steps 110-120. The graph 500 also shows that across most of the step range, the VCO output frequencies do not include the reference line 503 and substantially deviate from the reference line 503.

Without being limited by theory, the shape of the graph in FIG. 5A can be explained, at least in part, due to the proportional impacts of linear adjustments under a binary switching scheme. For example, consider a 1.0 pF capacitor in parallel with a 3-bit switched capacitor bank including three switched capacitor circuits of 0.1 pF, 0.2 pF, and 0.4 pF. The effective capacitance can range from 1.0 pF if none of the switched capacitor circuits are switched to be coupled in parallel, to 1.7 pF if all of the switched capacitors are switched to be coupled in parallel. When the first 0.1 pF capacitor is coupled in parallel such that the effective capacitance increases from 1.0 pF to 1.1 pF, the 0.1 pF is a 10% change, which is proportionally larger. However, when the 0.1 pF capacitor is coupled in parallel such that the effective capacitance increases from 1.6 pF to 1.7 pF, the 0.1 pF change is a 6.25% change, which is proportionally smaller. The proportional changes in capacitance can cause similarly proportional changes in output frequency. As shown in FIG. 5A, the initial steps cause proportionally larger changes in the output frequency, while the later steps cause proportionally smaller changes in the output frequency.

Figure 5B:
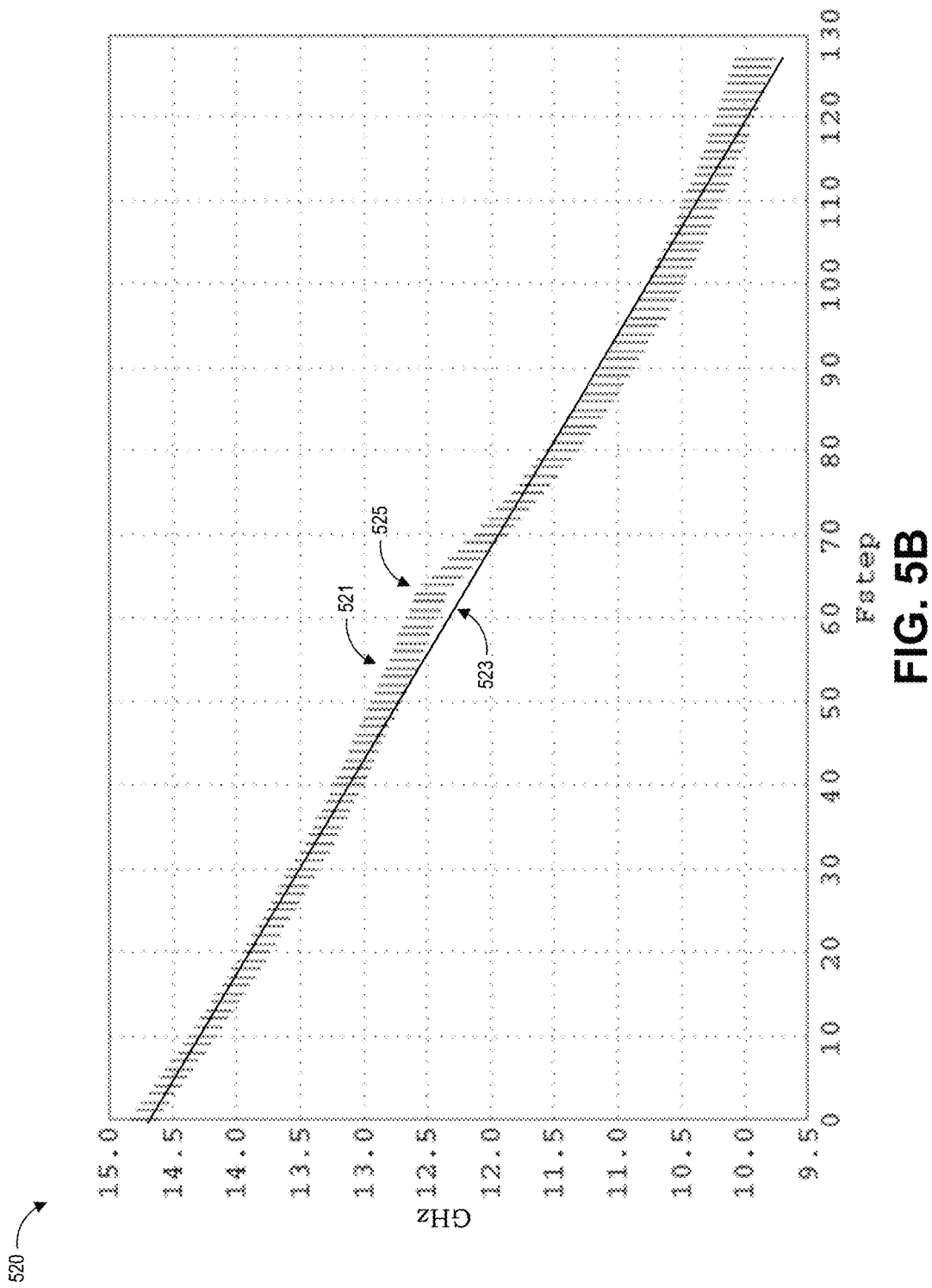
FIG. 5B shows an example graph of VCO frequency output ranges per step for a VCO having stepping having two switched capacitor banks that respond to step control signals.

FIG. 5B shows an example graph 520 of frequency output ranges per step for a VCO having two switched capacitor banks that respond to a step control signal (e.g., as shown in FIG. 4B). The y-axis shows the output frequency of the VCO output signal in gigahertz. The x-axis shows a frequency step (e.g., a control signal value). A plurality of vertical lines 521 at each step indicates a range of frequency values that can be output by the VCO for each selected step. Some VCO's can be tuned or calibrated—the frequency range covered by each vertical line indicates a possible tuning or calibration range. A straight, monotonically decreasing line 523 is drawn as a reference.

In comparison to the VCO outputs and reference line 503 in the graph 500 of FIG. 5A, the VCO outputs in graph 520 are closer to the reference line 523. Graph 520 also shows the reference line 523 is included within the calibration or tuning range of VCO outputs across a large range of steps. Where the VCO outputs deviate from the reference line 523, it does not deviate as significantly or across as many steps as compared to the graph 500. Accordingly, a VCO corresponding to the graph 520 can provide a more monotonic step response.

A first switched capacitor bank can operate in response to a first subset of control signals 0-63 to cause the VCO to have an output frequency within a first portion (e.g., about 14.8 GHz to about 12.5 GHz) of the frequency range (e.g., about 14.7 GHz to about 9.8 GHz). The first switched capacitor bank can also operate in response to a second subset of control signals 64-127 to cause the VCO to have an output frequency within a second portion (e.g., about 12.5 GHz to about 9.8 GHz) of the frequency range. A second switched capacitor bank can respond to the second subset of control signals 64-127 to cause the VCO to have an output frequency within the second portion (e.g., about 12.5 GHz to about 9.8 GHz) of the frequency range. The output frequency of the VCO can be independent of the capacitance of the second switched capacitor bank when the first subset of control signals is used to cause the VCO to have an output frequency falling within the first portion of the frequency range. The ranges are example values for an embodiment and not intended to be limiting.

Figure 5C:
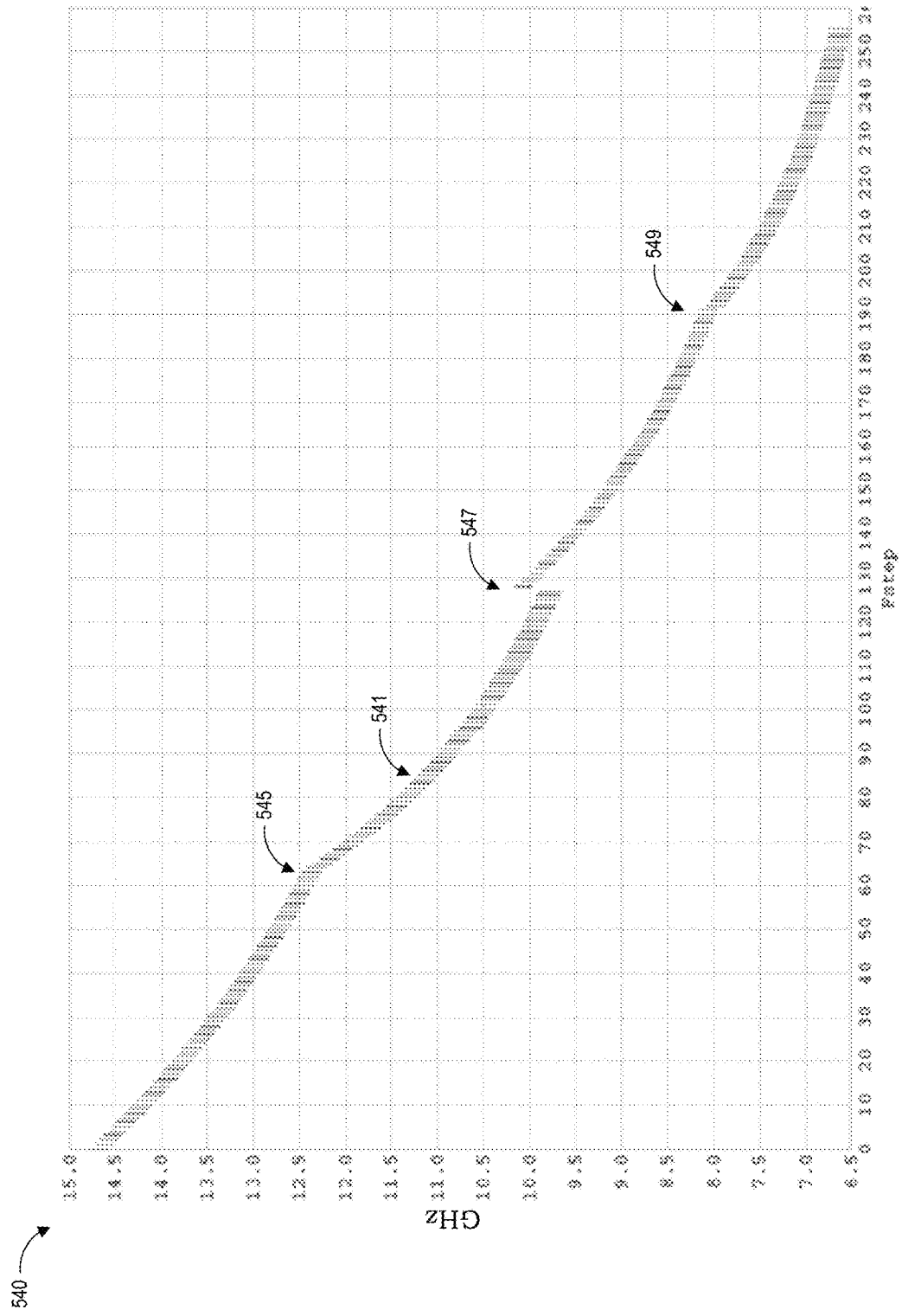
FIG. 5C shows an example graph of VCO frequency output ranges per step for a VCO having four switched capacitor banks that respond to step control signals.

FIG. 5C shows an example graph 540 of frequency output ranges per step for a VCO with four switched capacitor banks responding to a control signal. The y-axis shows the output frequency of the VCO output signal in gigahertz. The x-axis shows a frequency step (e.g., a control signal value). A plurality of vertical lines 541 indicates a range of frequency values that can be output by the VCO when for each selected step.

The technology disclosed herein can be extended to include any suitable number of switched capacitor banks. For example, a four switched capacitor bank setup can include a first switched capacitor bank with eight switched capacitor circuits, a second switched capacitor bank with seven switched capacitor circuits that begins to operate at about step 64, a third switched capacitor bank with six or seven switched capacitor circuits that begins to operate at about step 128, and a fourth switched capacitor bank with five to seven switched capacitor circuits that begins to operate at about step 192.

In FIG. 5B and FIG. 5C, the VCO outputs show a "bump" 525, 545, 547, or 549 when a new capacitor bank begins to turn on. In other words, at each bump, an additional switched capacitor bank activates to add to an effective capacitance of an LC tank circuit. The additional capacitors in a switched capacitor bank that turns on at each bump can contribute additional capacitance with each step change. The additional contributed capacitance can make the capacitance changes more proportional, which can cause the VCO frequency changes to also be more linear.

In some embodiments, a VCO can be calibrated or a subset of control signal values can be used such that the changes in actual output frequency can be monotonic and smooth without bumps. For example, in FIG. 5C, a bump occurs around step 128. In some embodiments, steps 128 to about 135 can be unused, and an input signal that would otherwise map to steps 128 to 135 would instead map to 136 to 144 (and other subsequent step mappings can also shift).

As shown in FIG. 5B and FIG. 5C, some VCOs can be designed to step through frequency ranges from about 10 GHz to about 14.7 GHz and from about 6.7 GHz to about 14.7 GHz. The VCOs can include a single VCO core or two or more VCO cores. With multiple switched capacitor banks, the number of VCO cores can be reduced. In some designs where capacitors are significantly smaller than inductors, adding more switched capacitor banks to reduce the number of VCO cores can reduce the overall size of the VCO.

FIG. 5B and FIG. 5C show linearization effects of parallel switched capacitor banks (e.g., as shown in FIG. 4B and FIG. 4C) by making the VCO response change more at higher frequency steps. In some embodiments, a plurality of switched capacitor banks can be coupled in series, and a control scheme and capacitor weighting scheme can be used to linearize the VCO response by making the VCO response change less at the initial frequency steps. The switched capacitor circuits in the series-coupled switched capacitor banks can have relatively low on-resistance and relatively small off-parasitic-capacitance to improve VCO performance. The series of switched capacitor banks can be implemented using an advanced semiconductor-on-insulator, such as silicon-on-insulator (SOI), technology. Moreover, a switched capacitor bank can be arranged in parallel with at least one other switched capacitor bank and arranged in series with at least one additional switched capacitor bank in accordance with the principles and advantages discussed herein.

Graphs Showing Frequency Output and Phase Noise

Figure 6A:
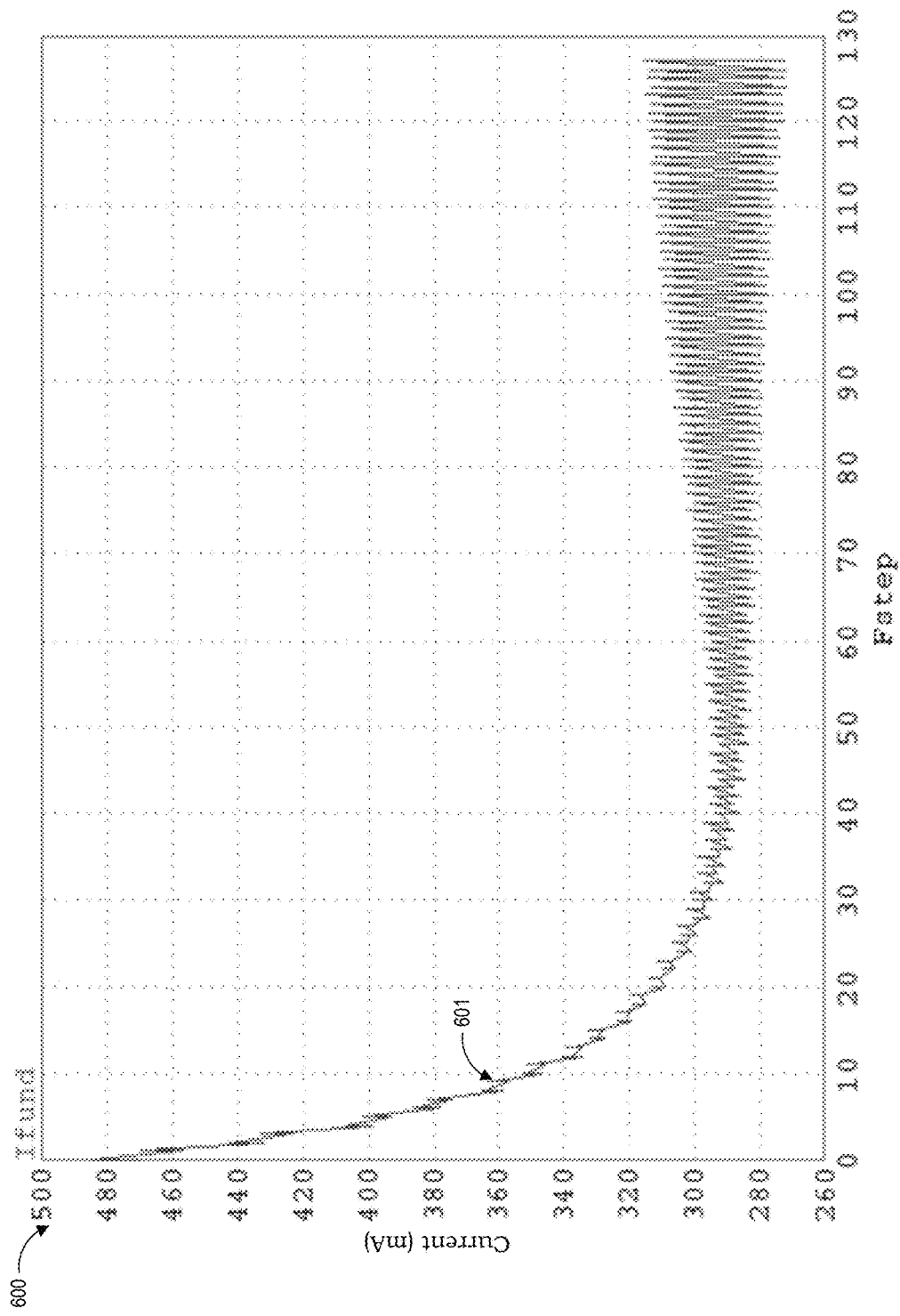
FIG. 6A shows an example graph of current through an LC tank resonator per step for a VCO having a single switched capacitor bank that responds to step control signals.

FIG. 6A shows an example graph 600 of current through an LC tank resonator per step for a VCO having a single switched capacitor bank that responds to a step control signal.

Figure 6B:
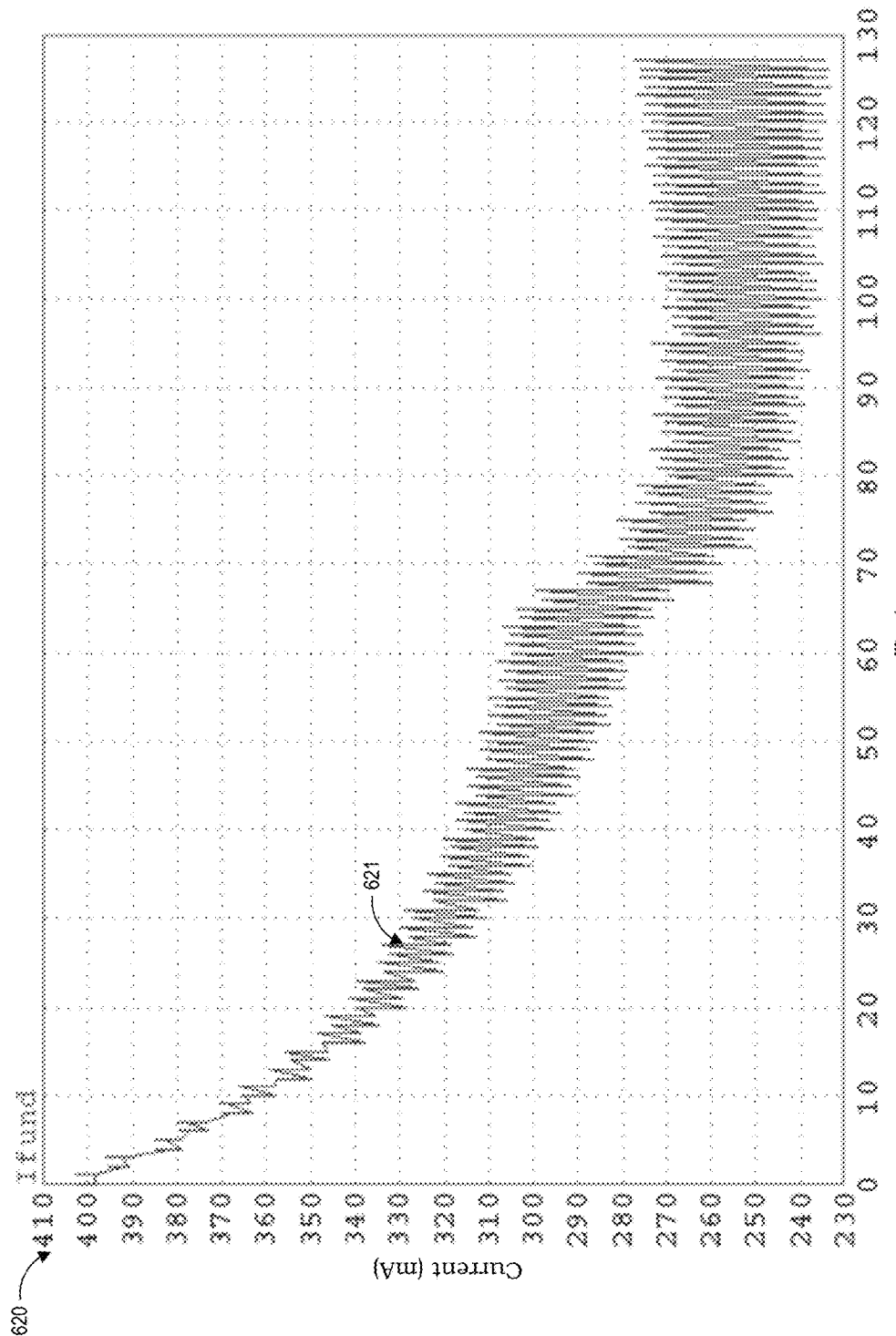
FIG. 6B shows an example graph of current through an LC tank resonator per step for a VCO having two switched capacitor banks that respond to step control signals.

FIG. 6B shows an example graph 620 of current through an LC tank resonator per step for a VCO having two switched capacitor banks that respond to step control signals (e.g., as shown in FIG. 4B).

In both FIG. 6A and FIG. 6B, the y-axis indicates an amount of current in milliamps (mA) and the x-axis indicates the step. The curves 601, 621 indicate the amount of current drawn by the LC tank resonator of a VCO.

The graph in FIG. 6B for a VCO with two capacitor banks shows improvements in the behavior of the current through the LC tank resonator as compared to the graph of FIG. 6A for the VCO with one capacitor bank. For example, the current in FIG. 6B changes more linearly and monotonically than in FIG. 6A. Also, the peak current drawn is about 400 mA in FIG. 6B, whereas the peak current drawn in FIG. 6A is about 480 mA. The current from steps 0 to 10 in FIG. 6B are less than or similar to the current in FIG. 6A from steps 0 to 10. In addition, FIG. 6B shows a smaller range of current values than in FIG. 6A over the frequency step range from 0 to 127. These characteristics can contribute to improved noise characteristics of the VCO and improved power efficiency.

Figure 6C:
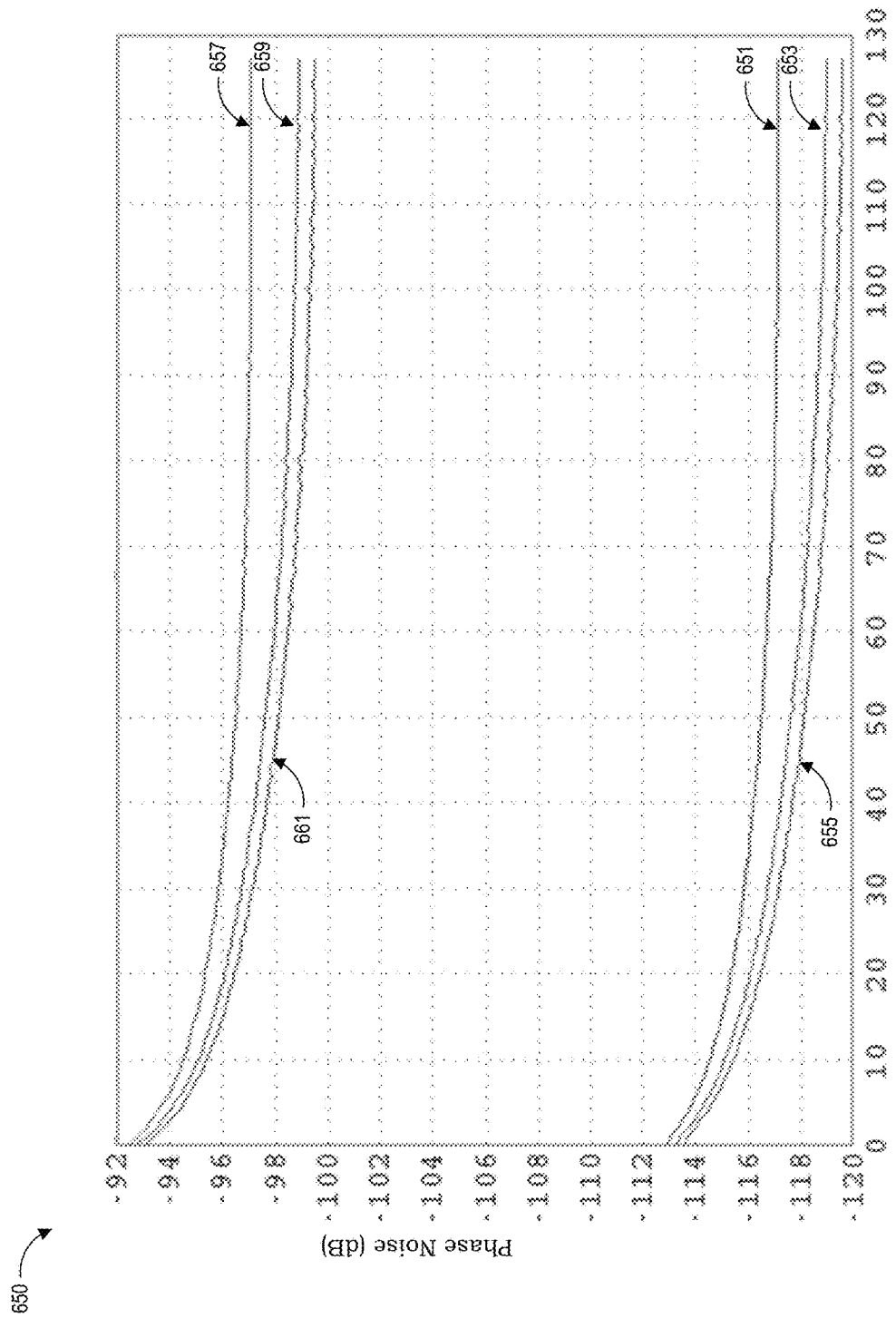
FIG. 6C shows an example simulated graph of phase noise of a VCO having a single switched capacitor bank that responds to step control signals.

FIG. 6C shows an example simulated graph 650 of phase noise of a VCO with a single switched capacitor bank responding to a step control signal. The y-axis shows the VCO phase noise in Decibels (dBc/Hz). The x-axis indicates the step. The curve 651 indicates phase noise of a 100 kHz signal with a 0.5 Volt VCO tuning voltage. The curve 653 indicates phase noise of a 100 kHz signal with a 1.3 Volt VCO tuning voltage. The curve 655 indicates phase noise of a 100 kHz signal with a 2.8 Volt VCO tuning voltage. The curve 657 indicates phase noise of a 10 kHz signal with a 0.5 Volt VCO tuning voltage. The curve 659 indicates phase noise of a 10 kHz signal with 1.3 Volt VCO tuning voltage. The curve 661 indicates phase noise of a 10 kHz signal with 2.8 Volt VCO tuning voltage.

Figure 6D:
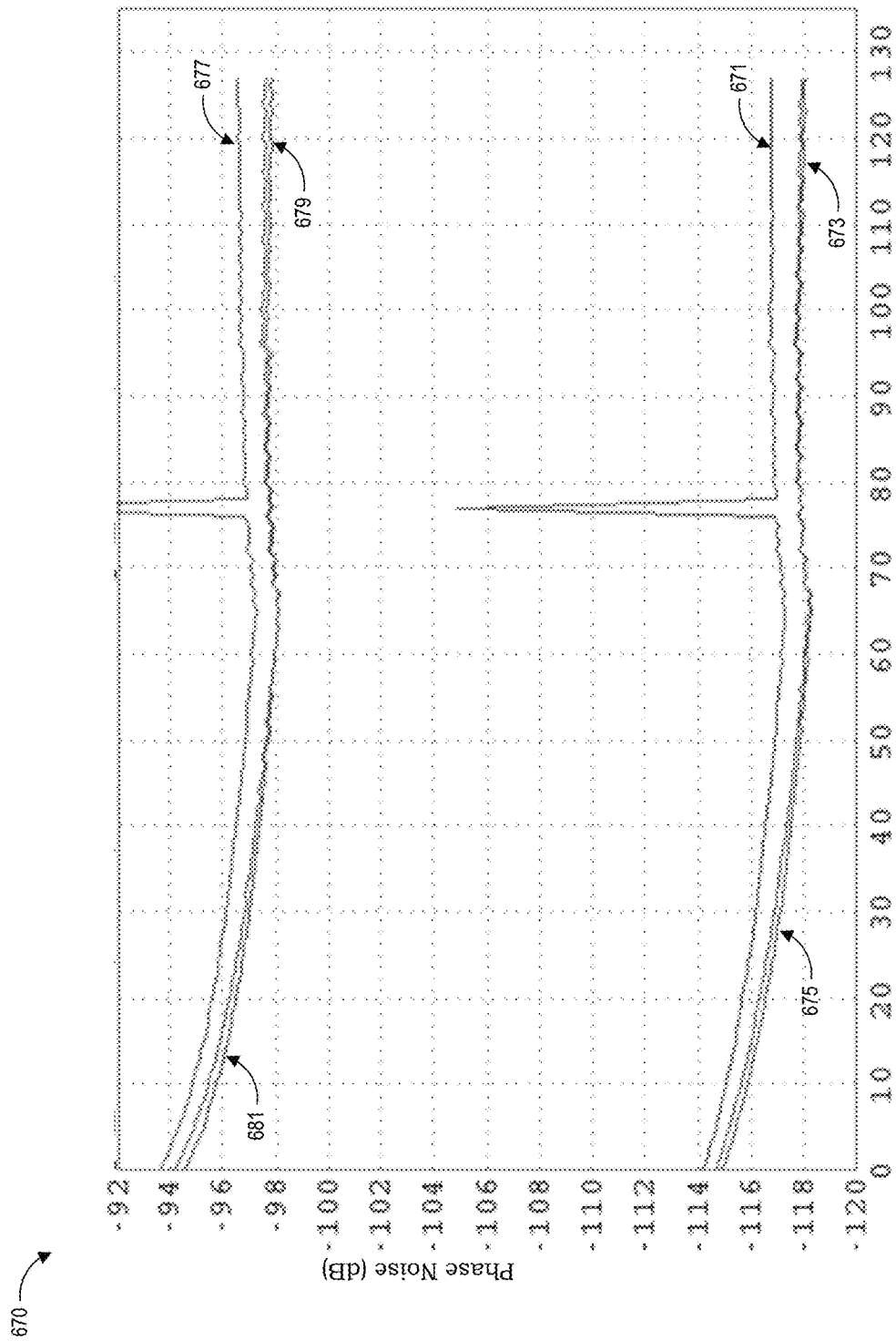
FIG. 6D shows an example simulated graph of phase noise of a VCO having two switched capacitor banks that respond to step control signals.

FIG. 6D shows an example simulated graph 670 of phase noise of a VCO having two switched capacitor banks that respond to step control signals. The y-axis shows the VCO phase noise in dBc/Hz. The x-axis indicates the step. The curve 671 indicates phase noise of a 100 kHz signal with 0.5 Volt VCO tuning voltage. The curve 673 indicates phase noise of a 100 kHz signal with 1.3 Volt VCO tuning voltage. The curve 675 indicates phase noise of a 100 kHz signal with 2.8 Volt VCO tuning voltage. The curve 677 indicates phase noise of a 10 kHz signal with 0.5 Volt VCO tuning voltage. The curve 679 indicates phase noise of a 10 kHz signal with 1.3 Volt VCO tuning voltage. The curve 681 indicates phase noise of a 10 kHz signal with 2.8 Volt VCO tuning voltage. The spike in phase noise around step 77 in certain graphs appears to be a simulation error due to non-convergence that does not manifest in actual circuits.

In comparing the phase noise, it can be seen that the maximum phase (ignoring the simulation error spike) noise in FIG. 6D is reduced by about 1-2 dB as compared to FIG. 6C.

Chamfered Inductor and Effects

An inductor can be made of conductive material. The inductor can be designed such that an extension of the inductor is used to interface with a plurality of switched capacitor banks (e.g., as shown in FIG. 3A, FIG. 3B, FIG. 4B, and FIG. 4C described above). The extension can be wider than a body of the inductor such that the inductor is dog-bone shaped. The inductor can be chamfered.

High frequency (e.g., RF/Microwave) current can dominantly flow along the outside of a dog-bone shaped conductor, giving relatively more uniform current between each switched capacitor circuit at the interface, reducing or removing non-monotonic behavior in VCOs. Current flow through the inductor can impact conductor loss and/or phase noise. The design can remove a parasitic current path, reduce the loss of the conductor, and improve phase noise when used in a VCO. The design can be applied to any other interfaces between conductors and other components, such as between a varactor and a conductor.

A conductor, such as a sheet of metal, can be chamfered at an extension of the conductor. The extension can be wider than the body of the metal sheet such that the metal sheet is dog-bone shaped. The extension can also be sufficiently wide to interface with another component. The high frequency current at the interface area can be emitted with more equalized current density than rectangular type inductors (e.g., as shown in FIG. 3A), where high frequency current flows along the outside of the rectangle, turns at the corner, and then flows toward the center of an interface.

With the chamfered, dog-bone shaped conductor designs discussed herein, the conductor can cause high frequency current to flow along the outside of the dog-bone shape to the interface, delivering relatively more uniform current to the interface. In embodiments where the conductor is an inductor that is coupled at the interface to a plurality of switched capacitor circuits, the design can give more uniform current to the switched capacitor circuits proportional to capacitance. This design can also reduce or remove non-monotonic behavior of a VCO using the inductor design in an LC tank circuit.

FIG. 7 shows an example layout 700 of chamfered microstrip inductors and an equivalent schematic representation 750. Switched capacitor banks can be located between the chamfered microstrip inductors, for example, as illustrated in the layout 700. The layout 700 includes a first inductor 701, a second inductor 711, and a third inductor 721. These inductors are non-rectangular microstrip inductors, with extension regions and chamfered joints. The first inductor 701 has a body 703, extensions 705a and 705b, and chamfered joints 707a and 707b. The second inductor 711 has a body 713, extensions 715a and 715b, and chamfered joints 717a and 717b. The third inductor 721 has a body 723, extensions 725a and 725b, and chamfered joints 727a and 727b. Lines 731, 732, and 733 outline other possible alternative designs for the chamfered joint.

FIG. 7 also includes a first plurality of switched capacitor banks 741 and a second plurality of switched capacitor banks 743. Schematics of switched capacitor banks are shown where the switched capacitor banks 741 and 743, respectively, are illustrated where the switched capacitor banks are present in the layout 700. In the layout 700, the elements are not necessarily drawn to scale. For example, the switched capacitor banks 741 and 743 are shown as covering a larger area than in some actual layout implementations to aid visibility and understanding. The equivalent schematic representation 750, which corresponds to the layout 700, shows a series connection of an inductor, a variable capacitor, an inductor, a variable capacitor, and an inductor. One or more of the variable capacitors can be implemented using variable capacitance circuit that includes a plurality of switched capacitor banks, such as shown and described with respect to FIG. 4B and FIG. 4C.

The bodies 703, 713, 723 of the inductors 701, 711, 721, respectively, can be microstrip line. The extensions 707, 715, 725 can be made of the same material as the bodies 703, 713, 723, respectively. As shown, the extensions 707, 715, 725 are at right angles from the bodies 703, 713, 723, respectively. In some other embodiments, the extensions can be at other angles, such as 45°. Different switched capacitor circuits of a switched capacitor bank (or different switched capacitor banks) can be physically connected to the extension at different points of the extension. The extensions can be included at one end or at opposing ends of the inductors as illustrated.

The chamfered joints 707, 717, 727 join respective extensions and bodies. Although the chamfered joints 707, 717, 727 are shown as right triangles, in other embodiments the chamfered joints 707, 717, 727 can be other shapes, including other types of triangles, have one or more curved sides, be at other angles, be other shapes, etc. In some embodiments, the chamfered joints can be smaller than illustrated. In some embodiments, the chamfered joints can be larger than illustrated, even reaching the ends of the extensions 715a or the middle of inductor 703.

FIG. 8 shows an example heat map 800 of current flow through a chamfered microstrip inductor. The switched capacitor banks are not shown. The densely dotted areas 807 along the outside of the inductor indicate the largest amounts of current flow. The less densely dotted areas 809 indicate lesser amounts of current flow. The lighter color areas 811 indicate areas of the least current flow, with increasingly darker areas indicating increasing amounts of current flow. Solid lines 801 and 803 indicate simplified paths where substantial amounts of current pass through the inductor. Although current should flow over the whole inductor, the edge (outside) side of inductor should carry more current than center (middle) area of inductor. The current density should decrease from the outside to the middle of the inductor. For comparison, dotted lines 805 indicate current paths through an inductor that is as wide as the widest part of the extension (e.g., similar to what is shown in FIG. 3A).

Due in part to the skin effect, the majority of the current as indicated by lines 801 and 803 should travel upward along the outside of the microstrip inductor and along the chamfered joint. The current may begin spreading out near the chamfered joint and flow to switched capacitors that may be coupled at various switched capacitor circuits coupled to different parts of the inductor extension. Independent of which part of the inductor extension the switched capacitor may be located, the current flows a similar distance and experiences a similar inductance.

The heat map 800 shows that the current distribution is relatively uniform around the interface in the extension of the bottom inductor and the extension of the top inductor. The chamfered joint can help direct current to travel parallel to the extension and spread out the current density. Accordingly, the effect of identical capacitors on resonant frequency, whether located toward the middle or toward the outside of the inductor extension, should be the same or similar. Because the current travels along the outside of an inductor body that is narrower than the extension, the current flow to the outside of the extensions can be reduced.

In comparison, the dotted line 805 indicates how current should flow through a rectangular shaped inductor shown in FIG. 3A. The current flows along the outside of the inductor and then travels different distances (such as up to about half of the width of the inductor) to reach a switched capacitor circuits coupled at or near an outer edge as compared to a switched capacitor circuit coupled at the middle of the width of the inductor. Beginning at a point where the current flows away from the outside of the inductor, the travel difference can be at least 2 times, 3 times, 4 times, 5 times, or 10 times farther for current to travel to a switched capacitor bank in the middle as opposed to a switched capacitor bank toward the outside of the inductor. This can cause uneven current distribution, where more current tends to flow toward the switched capacitor circuits on the outside of the inductor. The current that flows toward the middle of the inductor effectively passes through a longer length of inductor. If identical capacitors were coupled at the middle and at the outside of the rectangular shaped inductor, the resonant frequency would be relatively different if one identical capacitor were used instead of the other due to the difference in current reaching the capacitors. Comparatively, with a chamfered bone-shaped inductor design, the maximum travel difference of current can be reduced by about 25%-50%. After flowing along the outside of the inductor, the current may travel up to about one quarter or one third the width of the extension.

It can be counter-intuitive to design a narrow inductor so that there are extensions on the end. Widening the microstrip line typically causes the microstrip line to have lower resistance, and thus contribute to a higher quality factor (Q) of the VCO. However, a relatively high Q can materialize for switched capacitor circuits toward the outside of a rectangular inductor, but not as much for switched capacitor circuits toward the middle of the inductor. By designing an inductor with a chamfered extension and a relatively narrower body, a good current flow can be achieved for all or most switched capacitor circuits, regardless of which part of the extension the switching capacitor circuits are coupled to.

As shown in FIG. 8, a relatively high frequency current can be applied to a dog-bone shaped, chamfered inductor. A majority of the current can flow along the outside of the body of the inductor along a first direction. An extension at the end of the inductor can extend from the body along a second direction. The body can be narrower than the width of an extension at an end of the inductor. A majority of the current can flow along the outside of the chamfered joint in a direction having a vector component in the second direction. The current can be distributed to different parts of the extension where the extension interfaces with other circuits, such as a plurality of switched capacitor circuits. From the chamfered joint to the plurality of switched capacitor circuits, the current path can be substantially similar in length, regardless of where switched capacitor circuit is coupled. In some embodiments, the current can travels across less than 25%, 30%, 35%, 40%, etc. across a width of the extension to reach any switched capacitor circuit. The extension can extend any distance outward from the body, such as extending out about 25%, 50%, 75%, 100%, 200%, etc. the width of the body.

Figure 9:
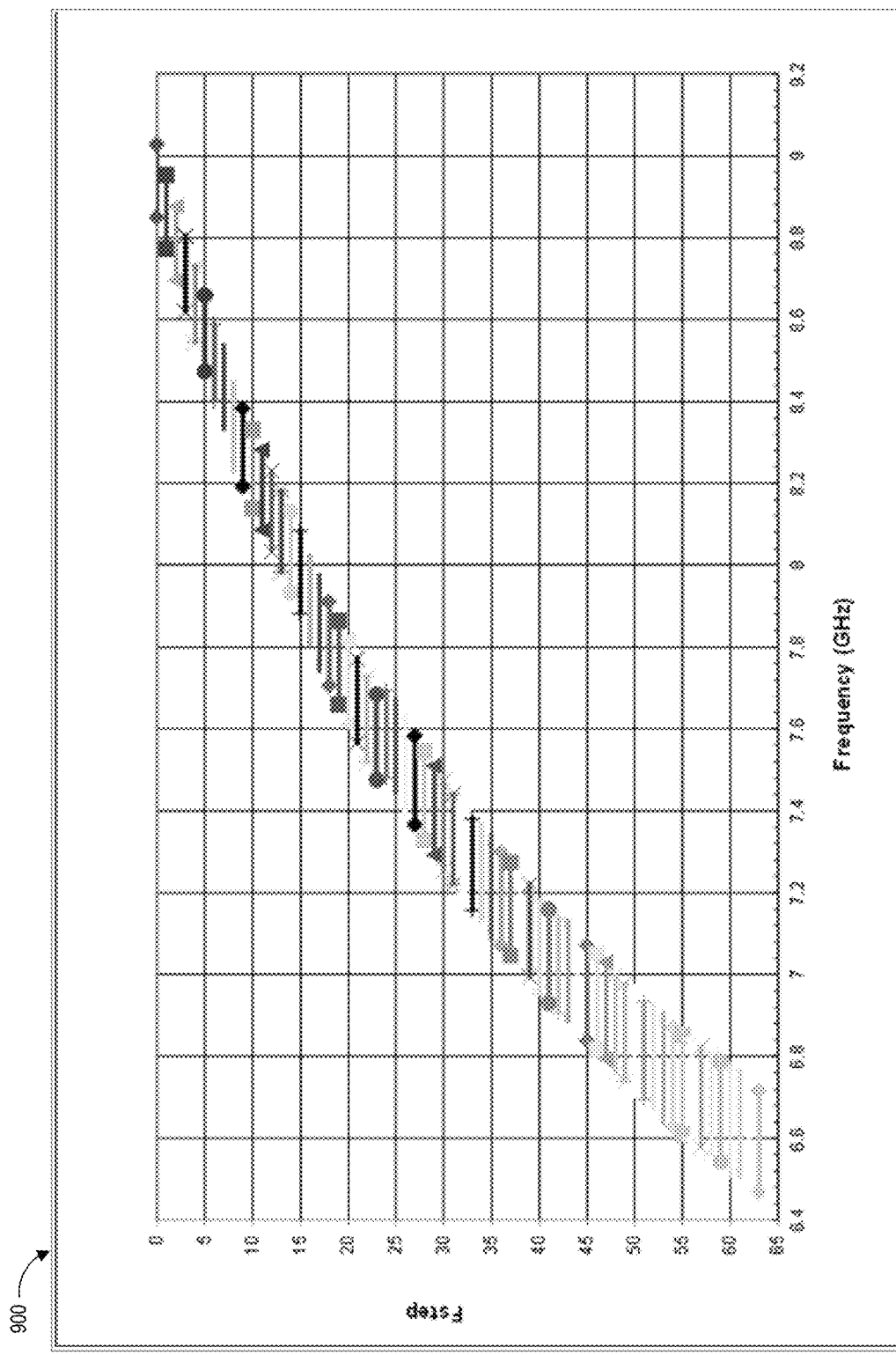
FIG. 9 shows an example graph of VCO output frequency across a plurality of steps for a VCO using chamfered, dog-bone shaped inductors.

FIG. 9 shows an example graph 900 of VCO output frequency across a plurality of steps for a VCO using chamfered, dog-bone shaped inductors in accordance with the principles and advantages of FIGS. 7 and/or 8. The x-axis indicates a VCO output frequency in GHz. The y-axis indicates the step. The horizontal lines indicate a tunable range of VCO output at each step. The graph shows operation of the VCO without glitches, errors, or other abnormalities with the chamfered dog-bone design.

Applications, Terminology, and Conclusion

Aspects of this disclosure can be implemented in various electronic devices. For instance, aspects of this disclosure can be implemented in any electronic device or electronic component that could benefit from a VCO with improved stepping linearity, lower phase noise, lower current consumption, or any combination thereof. As an example, aspects of this disclosure can be implemented in any electronic device or electronic component in communication applications, instrumentation devices, radar systems, aerospace systems, and defense systems. Examples of the electronic devices can include, but are not limited to, consumer electronic products, parts of the consumer electronic products, electronic test equipment, vehicular electronics systems, etc. Examples of the electronic devices can include, but are not limited to, computing devices, communications devices, electronic household appliances, automotive electronics systems, etc. Further, the electronic devices can include unfinished products.

Throughout the description and the claims, the words "comprise," "comprising," "include," "including," and the like are to generally be construed in an inclusive sense, as opposed to an exclusive or exhaustive sense; that is to say, in the sense of "including, but not limited to." The phrase "coupled to," as generally used herein, refers to two or more elements that may be either directly coupled to each other, or coupled by way of one or more intermediate elements. The phrase "coupled at," as generally used herein, refers to a point at which two or more elements are coupled to or connected to each other. The word "connected," as generally used herein, refers to two or more elements that are directly connected without one or more intermediate elements. Additionally, the words "herein," "above," "below," and words of similar import, when used in this application, shall refer to this application as a whole and not to any particular portions of this application. Where the context permits, words in the above Detailed Description using the singular or plural may also include the plural or singular, respectively. The word "or" in reference to a list of two or more items, is generally intended to encompass all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Conditional language is not generally intended to imply that features, elements and/or states are in any way required for one or more embodiments or that one or more embodiments necessarily include logic for deciding whether these features, elements and/or states are included or are to be performed in any particular embodiment.

The various features and processes described above may be used independently of one another, or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

What is claimed is:

1. A voltage-controlled oscillator (VCO) comprising:
an output node configured to provide an oscillating signal that has a frequency based at least in part on a voltage of an input signal, the oscillating signal being within a frequency range; and
a tank circuit comprising:
a first switched capacitor bank operable, in response to a plurality of control signals, to change the frequency of the oscillating signal over a first portion and a second portion of the frequency range;
a second switched capacitor bank coupled to the first switched capacitor bank, the second switched capacitor bank operable, in response to a subset of the plurality of control signals, to change the frequency of the oscillating signal over the second portion of the frequency range, wherein changes in the frequency of the oscillating signal are independent of the second switched capacitor bank over the first portion of the frequency range; and
an inductor coupled to the first switched capacitor bank and to the second switched capacitor bank.

2. The VCO of claim 1, wherein the first switched capacitor bank is coupled in parallel with the second switched capacitor bank.

3. The VCO of claim 1, wherein the first switched capacitor bank comprises a first plurality of binary-weighted, switched capacitor circuits coupled in parallel with each other.

4. The VCO of claim 3, wherein the second switched capacitor bank comprises a second plurality of switched capacitor circuits weighted to make changes in VCO output frequency more linear when the frequency control signal steps across the second portion of the frequency range in comparison to an absence of the second switched capacitor bank.

5. The VCO of claim 1, wherein:
the first switched capacitor bank includes first switched capacitor circuits, wherein each of the first switched capacitor circuits is configured to switch in response to a respective bit of the plurality of control signals; and
the second switched capacitor bank includes second switched capacitor circuits, and each of the second switched capacitor circuits is configured to switch, at least in part, in response to a respective bit of the subset of the plurality of control signals.

6. The VCO of claim 5, wherein the second switched capacitor circuits are configured to switch in a same order as a subset of the first switched capacitor circuits over the second portion of the frequency range.

7. The VCO of claim 1, wherein:
the first switched capacitor bank and the second switched capacitor bank are coupled in parallel between the inductor and a second inductor; and
switched capacitor circuits of the first and second switched capacitor banks are coupled to different points of an extension of the inductor that is either shaped like a portion of a dog bone in plan view or rectangular shaped.

8. The VCO of claim 1, further comprising a third switched capacitor bank coupled to the first and second switched capacitor banks, wherein the first switched capacitor bank includes more switched capacitor circuits than the second switched capacitor bank, and wherein the second switched capacitor bank includes more switched capacitor circuits than the third switched capacitor bank.

9. The VCO of claim 1, wherein:
the first switched capacitor bank is configured to change in capacitance, thereby changing the frequency of the oscillating signal, as a value of a frequency control signal steps through a first portion and a second portion of a range of control values;
the frequency of the oscillating signal is unaffected by a capacitance of the second switched capacitor bank while the frequency control signal steps through the first portion of the range of control values; and
the second switched capacitor bank is configured to change in capacitance, thereby changing the frequency at the output node as the value of the frequency control signal steps through the second portion of the range of control values.

10. A variable capacitance circuit comprising:
a first port;
a second port, wherein an effective capacitance across the first port to the second port is controlled by a plurality of control signals;
a first switched capacitor bank configured to change the effective capacitance in response to changes in the plurality of control signals across a range of values; and
a second switched capacitor bank configured to change the effective capacitance in response to changes in a subset of the plurality of control signals across a first subset of the range of values, wherein changes in the effective capacitance are independent of the second switched capacitor bank when the plurality of control signals change across a second subset of the range of values.

11. The variable capacitance circuit of claim 10, wherein the effective capacitance is determined based at least in part on a sum of a capacitance of the first switched capacitor bank and a capacitance of the second switched capacitor bank when the plurality of control signals have values within the first subset of the range of values, and wherein the effective capacitance is independent of the second switched capacitor bank when the plurality of control signals have values within the second subset of the range of values.

12. The variable capacitance circuit of claim 10, wherein:
the first switched capacitor bank comprises a first switched capacitor circuit that is configured to switch and affect the effective capacitance in response to a least significant bit of the plurality of control signals;
the first switched capacitor bank comprises a second switched capacitor circuit that is configured to switch and affect the effective capacitance in response to a most significant bit of the plurality of control signals; and
the second switched capacitor bank comprises a third switched capacitor circuit configured to switch, based at least in part on the least significant bit of the plurality of control signals, and the second switched capacitor circuit affects the effective capacitance only when a most significant bit of the plurality of control signals is asserted.

13. The variable capacitance circuit of claim 10, wherein the first switched capacitor bank comprises a plurality of binary weighted, switched capacitor circuits each comprising at least a switch and a capacitor, and wherein switched capacitor circuits in the second switched capacitor bank have different capacitances than the switched capacitor circuits in the first switched capacitor bank.

14. The variable capacitance circuit of claim 10, wherein switched capacitor circuits of the first switched capacitor bank are coupled to an extension of an inductor, and the inductor includes a body and a chamfered joint joining the body to the extension.

15. The variable capacitance circuit of claim 10, wherein the second switched capacitor bank includes fewer switched capacitor circuits than the first switched capacitor bank.

16. A method for adjusting an effective capacitance of a variable capacitance circuit comprising a first switched capacitor bank and a second switched capacitor bank, the method comprising:
switching one or more first switched capacitor circuits in the first switched capacitor bank using a plurality of control signals to adjust the effective capacitance of the variable capacitance circuit independent of the second switched capacitor bank; and
switching one or more second switched capacitor circuits in the second switched capacitor bank using a subset of the plurality of control signals while switching at least one of the first switched capacitor circuits using the plurality of control signals to adjust the effective capacitance of the variable capacitance circuit.

17. The method of claim 16, wherein the first switched capacitor circuits in the first switched capacitor bank are binary weighted and switched based on a binary encoding of a value of the plurality of control signals.

18. The method of claim 16, wherein the first switched capacitor bank and the second switched capacitor bank are coupled in parallel.

19. The method of claim 16, further comprising driving currents from an extension of an inductor through a first switched capacitor circuit and through a second switched capacitor circuit of the variable capacitance circuit, wherein the first switched capacitor circuit is coupled toward the outside of the extension and the second switched capacitor circuit is coupled toward a middle of the extension, the extension extending at an angle from a body of the inductor and meeting the body at a chamfered joint.

20. The method of claim 16, further comprising setting a value for the plurality of control signals based at least in part on a voltage of an input signal of a voltage controlled oscillator.

\* \* \* \* \*